US009722096B2

(12) United States Patent
Kawashima et al.

(10) Patent No.: US 9,722,096 B2
(45) Date of Patent: Aug. 1, 2017

(54) METHOD OF MANUFACTURING SEMICONDUCTOR DEVICE

(71) Applicant: Renesas Electronics Corporation, Koutou-ku, Tokyo (JP)

(72) Inventors: Yoshiyuki Kawashima, Tokyo (JP); Shoji Yoshida, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/872,089

(22) Filed: Sep. 30, 2015

(65) Prior Publication Data
US 2016/0099358 A1 Apr. 7, 2016

(30) Foreign Application Priority Data

Oct. 1, 2014 (JP) ................................. 2014-203281

(51) Int. Cl.
| | |
|---|---|
| *H01L 21/336* | (2006.01) |
| *H01L 29/792* | (2006.01) |
| *H01L 21/28* | (2006.01) |
| *H01L 21/30* | (2006.01) |
| *H01L 21/324* | (2006.01) |
| *H01L 27/11573* | (2017.01) |
| *H01L 29/66* | (2006.01) |
| *H01L 29/51* | (2006.01) |

(52) U.S. Cl.
CPC .... *H01L 29/7923* (2013.01); *H01L 21/28176* (2013.01); *H01L 21/28282* (2013.01); *H01L 21/3003* (2013.01); *H01L 21/324* (2013.01); *H01L 27/11573* (2013.01); *H01L 29/6659* (2013.01); *H01L 29/66833* (2013.01); *H01L 29/792* (2013.01); *H01L 29/513* (2013.01); *H01L 29/665* (2013.01); *H01L 29/66545* (2013.01)

(58) Field of Classification Search
CPC ............ H01L 21/0214; H01L 21/0217; H01L 21/28176; H01L 21/28282; H01L 29/792; H01L 29/6659; H01L 29/66833
USPC .......................... 438/257–26, 287, 257–267
See application file for complete search history.

(56) References Cited

U.S. PATENT DOCUMENTS

| | | | | |
|---|---|---|---|---|
| 5,691,225 | A | * 11/1997 | Abiko ............. | H01L 21/823835 257/E21.165 |
| 2007/0102754 | A1* | 5/2007 | Chen ..................... | H01L 27/105 257/324 |

FOREIGN PATENT DOCUMENTS

JP          2011-96772 A        5/2011

* cited by examiner

*Primary Examiner* — Brook Kebede
(74) *Attorney, Agent, or Firm* — Shapiro, Gabor and Rosenberger, PLLC

(57) ABSTRACT

A semiconductor device including a nonvolatile memory cell and a field effect transistor together is improved in performance. In a method of manufacturing a semiconductor device, a hydrogen-containing insulating film is formed before heat treatment of a semiconductor wafer, the hydrogen-containing insulating film covering a gate electrode and a gate insulating film in a region that will have a memory cell therein, and exposing a region that will have therein a MISFET configuring a peripheral circuit. Consequently, hydrogen in the hydrogen-containing insulating film is diffused into an interface between the gate insulating film and the semiconductor substrate, and thereby a defect at the interface is selectively repaired.

12 Claims, 22 Drawing Sheets

FIG. 41

| OPERATION TYPE WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|
| SSI (WRITE)/FN (ERASE) | 10/5/1/0.5/0 | 12/0/0/0/0 | 0/0/1.5/1.5/0 |

METHOD OF MANUFACTURING SEMICONDUCTOR DEVICE

CROSS-REFERENCE TO RELATED APPLICATIONS

The disclosure of Japanese Patent Application No. 2014-203281 filed on Oct. 1, 2014 including the specification, drawings and abstract is incorporated herein by reference in its entirety.

BACKGROUND

The present invention relates to a method of manufacturing a semiconductor device. For example, the method is usable in manufacturing a semiconductor device having a nonvolatile memory.

Electrically erasable and programmable read only memory (EEPROM) is widely used as a nonvolatile semiconductor storage device that is electrically writable and erasable. Such a storage device, which is typified by flash memory being currently widely used, has a conductive floating gate electrode enclosed by an oxide film or a trapping insulating film under a gate electrode of a metal insulator semiconductor field effect transistor (MISFET). In the storage device, a charge storage state in the floating gate or the trapping insulating film is used as memory information and read as the threshold of a transistor.

Recently, it is examined that a memory cell having a metal oxide nitride oxide semiconductor (MONOS) structure is used as the nonvolatile memory. Japanese Unexamined Patent Application Publication No. 2011-96772 describes that a defect formed at an interface between a gate insulating film and a substrate is repaired through heat treatment (hydrogen anneal) in a hydrogen atmosphere.

SUMMARY

In particular, for a MONOS memory cell, hydrogen is importantly introduced into an interface between a gate insulating film including a charge storage film and a semiconductor substrate to repair the defect at the interface. However, when a complementary metal oxide semiconductor (CMOS) and a nonvolatile memory are mounted together on a semiconductor substrate, hydrogen anneal causes variations in properties of a semiconductor element on the semiconductor substrate.

Other issues and novel features will be clarified from the description of this specification and the accompanying drawings.

According to one embodiment of the invention, there is provided a method of manufacturing a semiconductor device. In the method, a hydrogen-containing insulating film is formed before heat treatment of a semiconductor wafer, the insulating film covering a gate electrode and a gate insulating film in a region that will have a memory cell therein, and exposing a region that will have therein a MISFET configuring a peripheral circuit.

According to the one embodiment of the invention, performance of the semiconductor device can be improved. Alternatively, manufacturing cost of the semiconductor device can be reduced.

BRIEF DESCRIPTION OF THE DRAWINGS

FIG. 41 is a Table showing an exemplary condition of voltage application to each section of a selected memory cell for each of "write", "erase", and "read".

DETAILED DESCRIPTION

Hereinafter, some embodiments of the invention will be described in detail with reference to the accompanying drawings. In all drawings for explaining the following embodiments, components having the same function are designated by the same numeral, and duplicated description is omitted. In such embodiments, an equivalent or similar portion is not repeatedly described except for a particularly required case.

First Embodiment

The technical idea of the first embodiment is on a semiconductor device that is designed such that a MONOS rewritable nonvolatile memory and a MISFET configuring a peripheral circuit or the like of the nonvolatile memory are provided in one semiconductor chip.

The semiconductor devices of the first embodiment and other embodiments described later each include a nonvolatile memory (nonvolatile storage element, nonvolatile memory, or nonvolatile semiconductor storage device). In the first embodiment and other embodiments, the nonvolatile memory is described with a memory cell based on an n-channel MISFET. In the first embodiment and other embodiments, polarity (polarity of an applied voltage for each of write, erase, and read, or polarity of a carrier or the like) is shown to describe operation of a memory cell based on an n-channel MISFET. For a memory cell based on a p-channel MISFET, the same operation is in principle given by inverting polarity of any of an applied potential, a conductivity type of carrier, and the like.

Method of Manufacturing Semiconductor Device

A method of manufacturing a semiconductor device of the first embodiment is described with reference to FIGS. 1 to 17. The semiconductor device of the first embodiment includes a single-gate MONOS memory.

Figure 1:
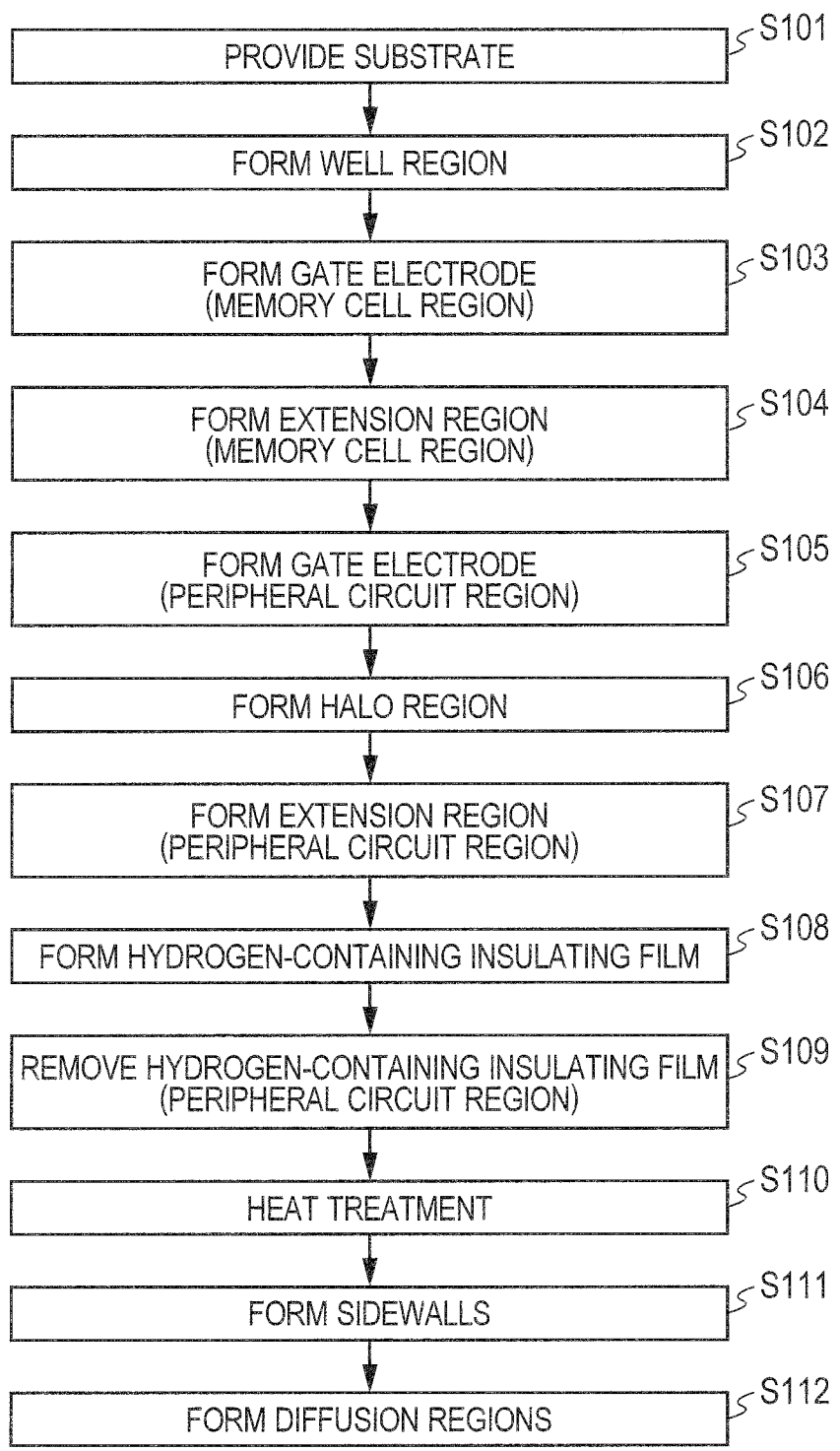
FIG. 1 is a flowchart illustrating a manufacturing process of a semiconductor device of a first embodiment.

FIG. 1 is a flowchart illustrating a manufacturing process of the semiconductor device of the first embodiment. FIGS. 2 to 17 are each a sectional view of the semiconductor device of the first embodiment during the manufacturing process. FIGS. 2 to 17 are each a sectional view illustrating a memory cell region 1A on its left side and a peripheral circuit region 1B on its right side. FIGS. 2 to 17 show a sequential process of forming a memory cell of the nonvolatile memory in the memory cell region 1A and forming a low-withstand-voltage MISFET in the peripheral circuit region 1B. The memory cell region 1A and the peripheral circuit region 1B are provided side by side on a main surface side of one semiconductor substrate in a direction along the main surface.

The nonvolatile memory is a type of storage element capable of electrically performing write operation and erase operation, and is also referred to as electrically erasable programmable read only memory. The nonvolatile memory of the first embodiment has a single-gate memory cell structure configured of a MONOS field effect transistor (hereinafter, referred to as MONOS memory in some case) having one gate electrode. The MONOS memory performs write operation and erase operation with the Fowler-Nordheim tunneling phenomenon (FN tunneling), for example.

Although the MONOS memory probably performs write operation and erase operation by a method using hot electron or hot hole, the MONOS memory of the first embodiment performs write/erase operations by the FN method instead of the method using such hot carrier.

Since a high potential difference (about 12 V) is applied to the MONOS transistor for write operation of the nonvolatile memory, a relatively high-withstand-voltage transistor is required as the MONOS transistor.

The peripheral circuit includes circuits other than the nonvolatile memory, such as a processor including CPU, a control circuit, a sense amplifier, a column decoder, a raw decoder, and an input/output circuit. The MISFET provided in the peripheral circuit region 1B is a low-withstand-voltage MISFET for the peripheral circuit. Since FN tunneling current is used for data rewriting, data can be rewritten at a low current, leading to low power consumption.

A high-withstand-voltage MISFET having a relatively high withstand voltage is also provided on the semiconductor substrate, and configures an input/output (I/O) circuit or the like. The I/O circuit outputs data from a semiconductor chip to a device that is externally coupled to the semiconductor chip, or inputs data from such an external device to the semiconductor chip. The high-withstand-voltage MISFET has a structure substantially similar to a structure of the low-withstand-voltage MISFET except for gate length of a gate electrode and thickness of a gate insulating film.

The n-channel MISFET provided in the peripheral circuit region 1B in FIGS. 2 to 17 is a field effect transistor configuring CMOS, and a p-channel MISFET is also provided in an undepicted region. A high-withstand-voltage MISFET is also provided in the undepicted region.

Figure 2:
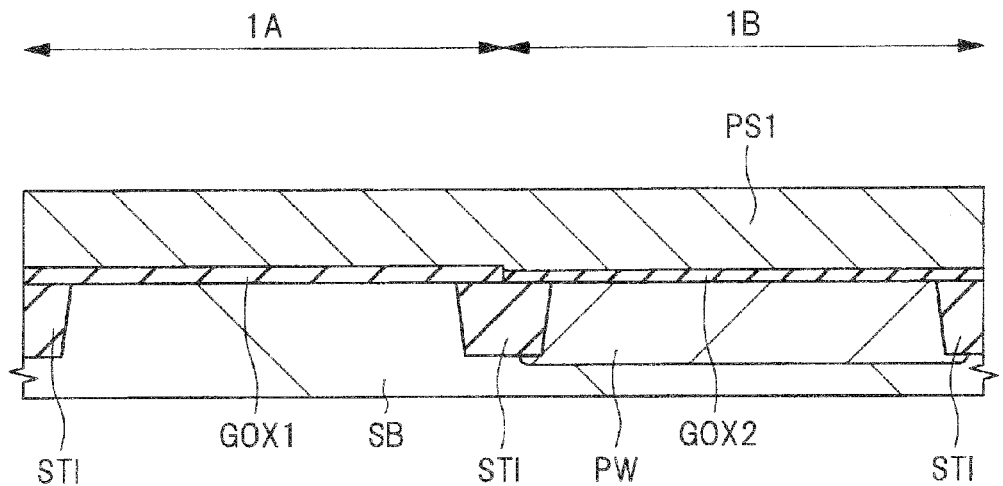
FIG. 2 is a sectional view of the semiconductor device of the first embodiment during the manufacturing process.

In the manufacturing process of the semiconductor device of the first embodiment, first, as illustrated in FIG. 2, there is provided a semiconductor substrate SB composed of silicon (Si) single crystal doped with a p-type impurity such as boron (B) (step S101 in FIG. 1). The semiconductor substrate SB has a substantially disc shape and configures a semiconductor wafer. Subsequently, element isolation regions STI are formed in the semiconductor substrate SB. The element isolation regions STI are provided to prevent a plurality of semiconductor elements on the semiconductor substrate SB from interfering with one another.

Each element isolation region STI can be formed by a shallow trench isolation (STI) process, for example. In the STI process, the element isolation region STI is formed in the following manner. Specifically, an element isolation trench is formed in the semiconductor substrate SB by a photolithography technique and an etching technique. An insulating film (such as a silicon oxide film) is formed on the semiconductor substrate SB so as to fill the element isolation trench, and then the unnecessary silicon oxide film on the semiconductor substrate SB is removed by chemical mechanical polishing (CMP).

The insulating film (such as the silicon oxide film) is filled only within the element isolation trench through such a step, and thus the element isolation region STI is formed. Consequently, as illustrated in FIG. 2, the memory cell region 1A is separated from the peripheral circuit region 1B by the element isolation region STI.

Subsequently, a p-type impurity such as boron (B) is introduced into an upper surface of the semiconductor substrate SB by a photolithography technique and an ion implantation process, thereby a p-type well PW composed of a p-type semiconductor region is formed in the semiconductor substrate SB (step S102 in FIG. 1).

Subsequently, the surface of the semiconductor substrate SB is washed by dilute hydrofluoric acid or the like, and then an insulating film GOX2 is formed on the semiconductor substrate SB in the peripheral circuit region 1B, and an insulating film GOX1 is formed on the semiconductor substrate SB in the memory cell region 1A. The insulating films GOX1 and GOX2 are formed of, for example, a silicon oxide film. The insulating film GOX1 has a thickness larger than the insulating film GOX2, and is used, for example, as a gate insulating film of the high-withstand-voltage MISFET in the undepicted region. Subsequently, a polysilicon film (polycrystalline silicon film) PS1 is formed over the entire main surface of the semiconductor substrate SB by a chemical vapor deposition (CVD) process, for example. In other words, the polysilicon film PS1 is formed over each of the insulating films GOX1 and GOX2.

Figure 3:
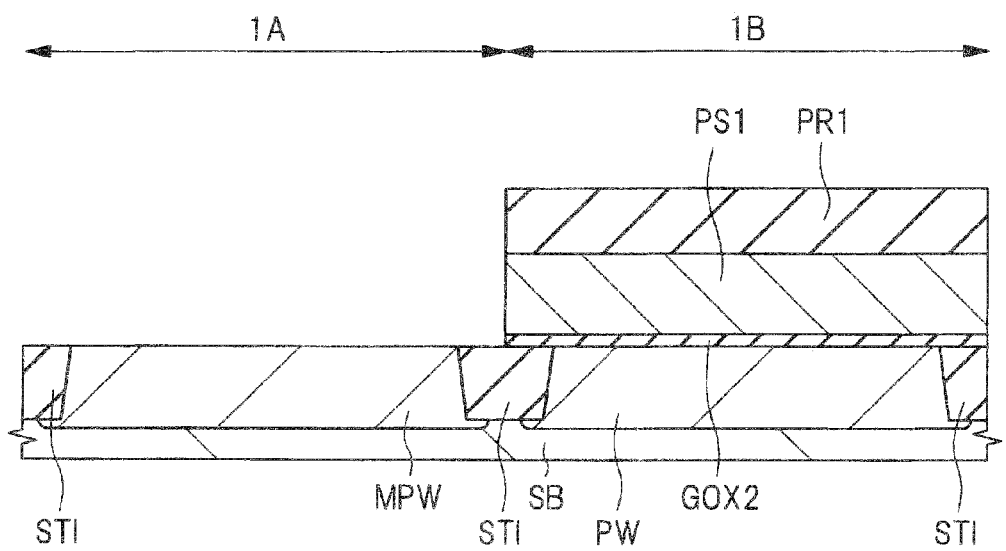
FIG. 3 is a sectional view of the semiconductor device during the manufacturing process following FIG. 2.

Subsequently, as illustrated in FIG. 3, a resist film PR1 is applied onto the polysilicon film PS1, and then the resist film PR1 is patterned by a photolithography technique. In the patterning, the resist film PR1 is processed so as to cover the peripheral circuit region 1B and expose the memory cell region 1A. The polysilicon film PS1 and the insulating film GOX1 in the memory cell region 1A are then removed by etching with the patterned resist film PR1 as a mask. Subsequently, a p-type well MPW is formed in the semiconductor substrate SB in the memory cell region 1A by an ion implantation process with the patterned resist film PR1 as a mask (step S102 in FIG. 1)

Figure 4:
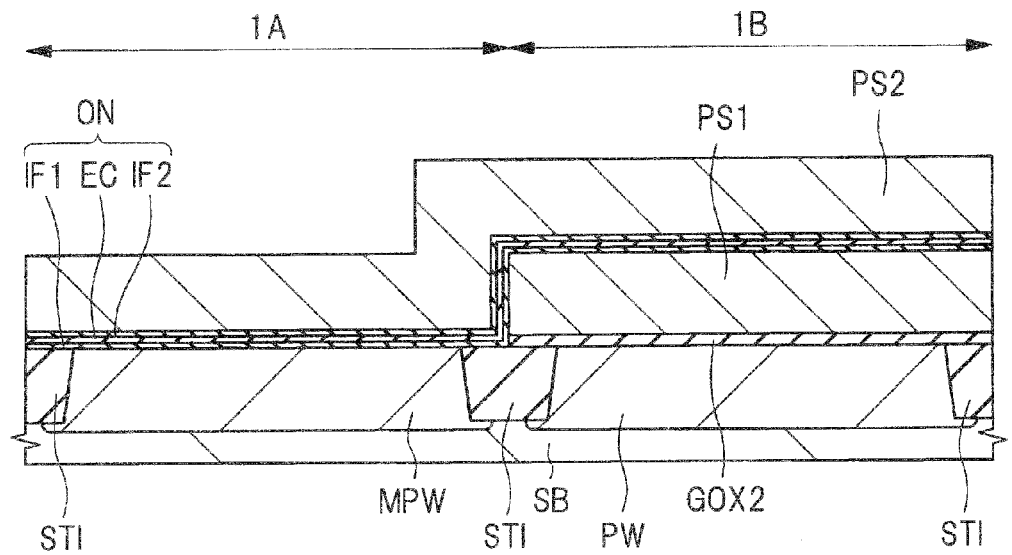
FIG. 4 is a sectional view of the semiconductor device during the manufacturing process following FIG. 3.

Subsequently, as illustrated in FIG. 4, an insulating film IF1 is formed over the semiconductor substrate SB and the polysilicon film PS1, and a charge storage film (charge retention film) EC is formed over the insulating film IF1. An insulating film IF2 is then formed over the charge storage film EC, and a polysilicon film PS2 is formed over the insulating film IF2.

For example, the insulating film IF1 is formed of a silicon oxide film. The formation step of the insulating film IF1 can be performed with an in-situ steam generation (ISSG) oxidation process that allows formation of a silicon oxide film having close and good film quality. The insulating film IF1 has a thickness of about 4 nm.

The charge storage film EC is formed of a silicon nitride film, and can be formed by a CVD process, for example. The charge storage film EC has a thickness of about 10 nm. The insulating film IF2 is formed of a silicon oxide film. The formation step of the insulating film IF2 can be performed with a high temperature oxide (HTO) process that allows formation of a silicon oxide film having close and good film quality. The insulating film IF2 has a thickness of about 5 nm.

The polysilicon film PS2 can be formed by a CVD process, for example. In this way, there can be formed a stacked insulating film (ONO film ON) having close and good film quality with high dielectric strength, and internally including the charge storage film EC.

Figure 5:
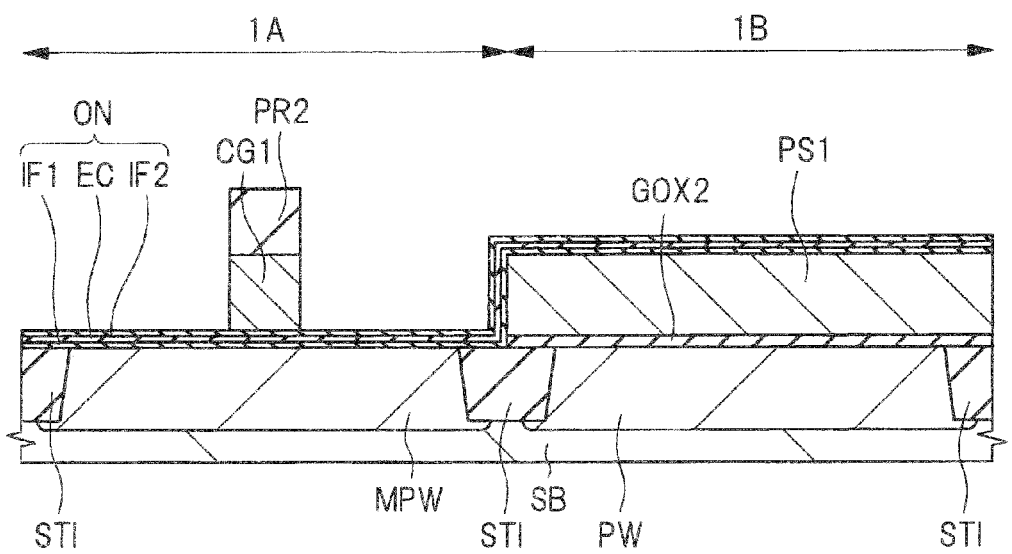
FIG. 5 is a sectional view of the semiconductor device during the manufacturing process following FIG. 4.

Subsequently, as illustrated in FIG. 5, a resist film PR2 is applied onto the polysilicon film PS2, and then the resist film PR2 is patterned by a photolithography technique. The resist film PR2 is patterned so as to cover a gate electrode formation region in the memory cell region 1A and the peripheral circuit region 1B. The polysilicon film PS2 is patterned by an etching technique with the patterned resist film PR2 as a mask, thereby a gate electrode CG1 is formed in the memory cell region 1A (step S103 in FIG. 1).

In this step, although a residue of the polysilicon film PS2 provably exists in a sidewall shape on a side wall of the polysilicon film PS1 with the ONO film ON in between on the element isolation region STI near a boundary between the memory cell region 1A and the peripheral circuit region 1B, FIG. 5 omits illustration of such a residue.

Figure 6:
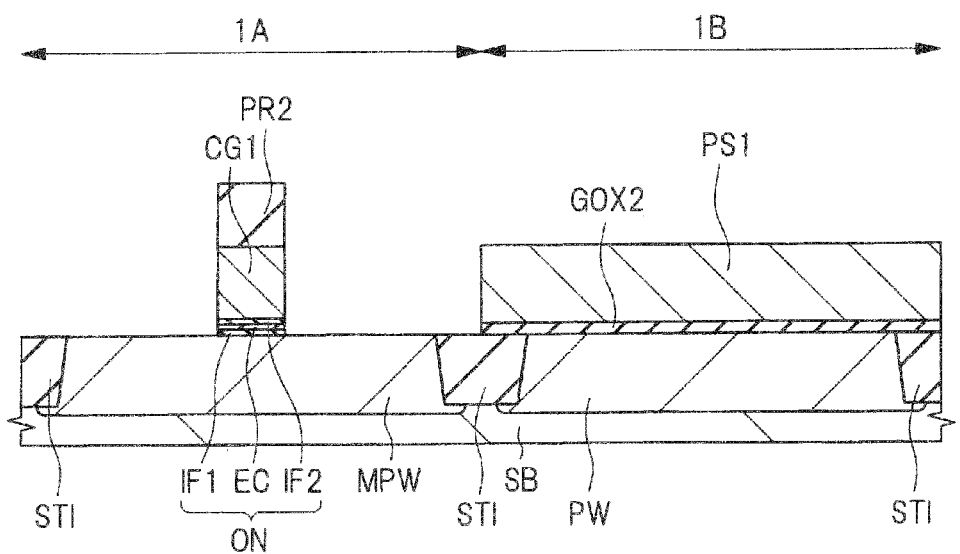
FIG. 6 is a sectional view of the semiconductor device during the manufacturing process following FIG. 5.

Subsequently, as illustrated in FIG. 6, the uncovered insulating film IF2, charge storage film EC, and insulating film IF1 are removed by a dry etching technique, for example. As a result, a stacked insulating film composed of the insulating film IF1, the charge storage film EC, and the insulating film IF2 remains directly under the gate electrode CG1 provided in the memory cell region 1A. The ONO film ON composed of the insulating film IF1, the charge storage film EC, and the insulating film IF2 directly under the gate electrode CG1 configures a gate insulating film of a field effect transistor configuring a memory cell to be formed later.

Figure 7:
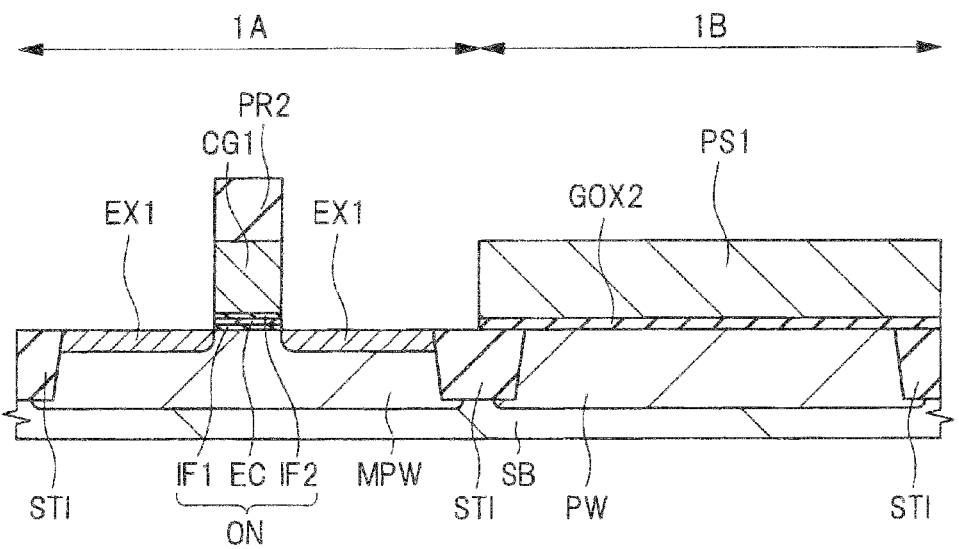
FIG. 7 is a sectional view of the semiconductor device during the manufacturing process following FIG. 6.

Subsequently, as illustrated in FIG. 7, extension regions (n⁻ semiconductor regions, low-concentration impurity diffusion regions) EX1 matched with the gate electrode CG1 are formed in the semiconductor substrate SB in the memory cell region 1A by an ion implantation process that directly uses a mask composed of the patterned resist film PR2 (step S104 in FIG. 1). In other words, in the first embodiment, the mask used for processing the gate electrode CG1 of the MONOS transistor is in common with the mask used for the ion implantation for forming the extension regions EX1 matched with the gate electrode CG1 of the MONOS transistor. Thus, the first embodiment can eliminate provision of an additional mask required for collectively providing the MONOS transistor.

In the ion implantation step illustrated in FIG. 7, since the polysilicon film PS1 in the peripheral circuit region 1B is exposed, the n-type impurity is also introduced into the polysilicon film PS1. In such a case, implantation energy is adjusted during the ion implantation step, so that it is possible to prevent the n-type impurity from penetrating through the polysilicon film PS1 and being introduced into the semiconductor substrate SB in the peripheral circuit region 1B.

Figure 8:
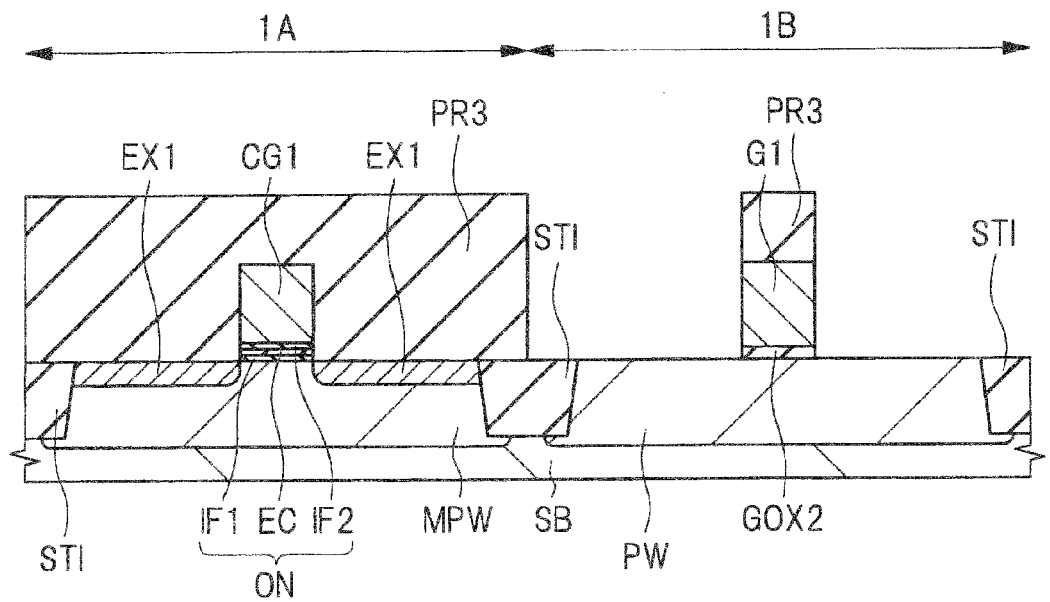
FIG. 8 is a sectional view of the semiconductor device during the manufacturing process following FIG. 7.

Subsequently, as illustrated in FIG. 8, the patterned resist film PR2 is removed, and then a resist film PR3 is applied across the memory cell region 1A and the peripheral circuit region 1B. Specifically, the resist film PR3 is applied so as to cover the gate electrode CG1 in the memory cell region 1A, and cover the polysilicon film PS1 in the peripheral circuit region 1B. Subsequently, the resist film PR3 is patterned by a photolithography technique. The resist film PR3 is patterned so as to cover the memory cell region 1A, and cover a gate electrode formation region in the peripheral circuit region 1B. The polysilicon film PS1 is processed by etching with the patterned resist film PR3 as a mask to form a gate electrode G1 in the peripheral circuit region 1B (step S105 in FIG. 1).

Figure 9:
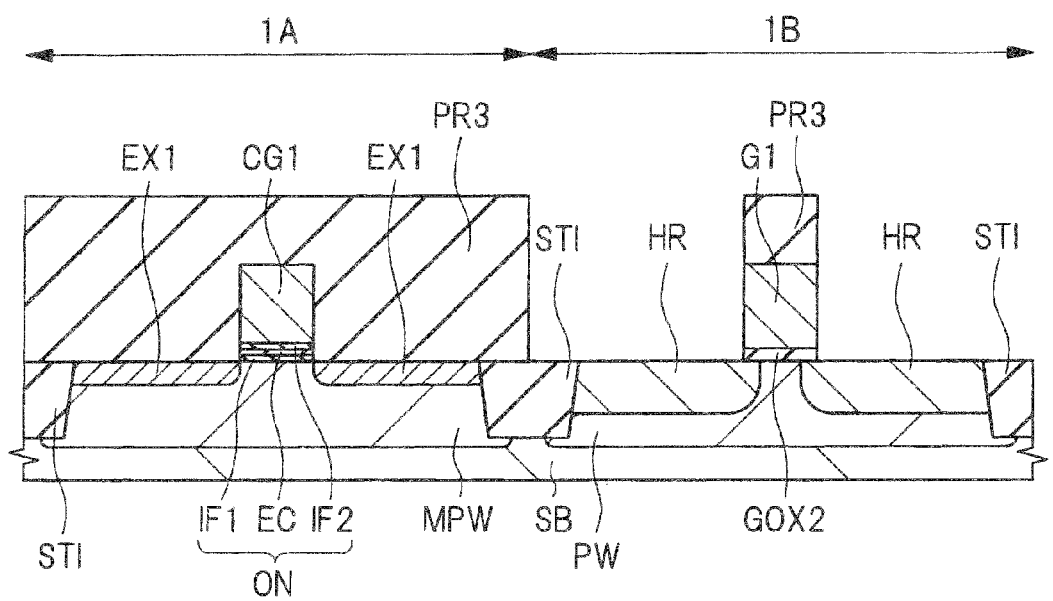
FIG. 9 is a sectional view of the semiconductor device during the manufacturing process following FIG. 8.

Subsequently, as illustrated in FIG. 9, a p-type impurity (for example, boron (B)) is implanted into the main surface of the semiconductor substrate SB in the peripheral circuit region 1B with the resist film PR3 as a mask. This results in formation of a pair of halo regions (p⁻ semiconductor regions) HR in main surfaces of semiconductor substrate SB portions on both sides of the gate electrode G1 in the peripheral circuit region 1B (step S106 in FIG. 1). In the halo implantation for forming the halo regions HR, an impurity having a conductivity type, which is opposite to the conductivity type of an impurity in source/drain regions including extension regions EX2 (see FIG. 10) and diffusion regions D2 (see FIG. 14) to be formed later in the peripheral circuit region 1B, is introduced into regions adjacent to the extension regions EX2.

The halo regions HR are formed through obliquely ion-implanting the p-type impurity to the main surface of the semiconductor substrate SB. In other words, the p-type impurity is implanted at an oblique incident angle to the main surface of the semiconductor substrate SB rather than a perpendicular incident angle to the main surface. For example, such oblique ion implantation is performed at an angle of 45° with respect to the main surface of the semiconductor substrate SB. Since such oblique ion implantation is performed, each halo region HR is formed near a region directly below the center of the gate electrode G1 in a gate length direction of the gate electrode G1. The halo region HR may be selectively formed only near a region directly below an end of the gate electrode G1.

The halo region HR suppresses expansion of a depletion layer extending in a lateral direction from each extension region EX2 to be formed later. Formation of the halo region HR therefore improves roll off at short channel, for example, roll-off characteristics (Lg-Vth characteristics) of threshold voltage (Vth) to gate length (Lg), and thus a relationship between ON current and OFF current can be appropriately maintained. This is because the halo region HR suppresses the expansion of the depletion layer, and decreases the gate length, which increases channel impurity concentration per gate length, so that lowering of Vth due to the short channel effect can be somewhat cancelled.

Figure 10:
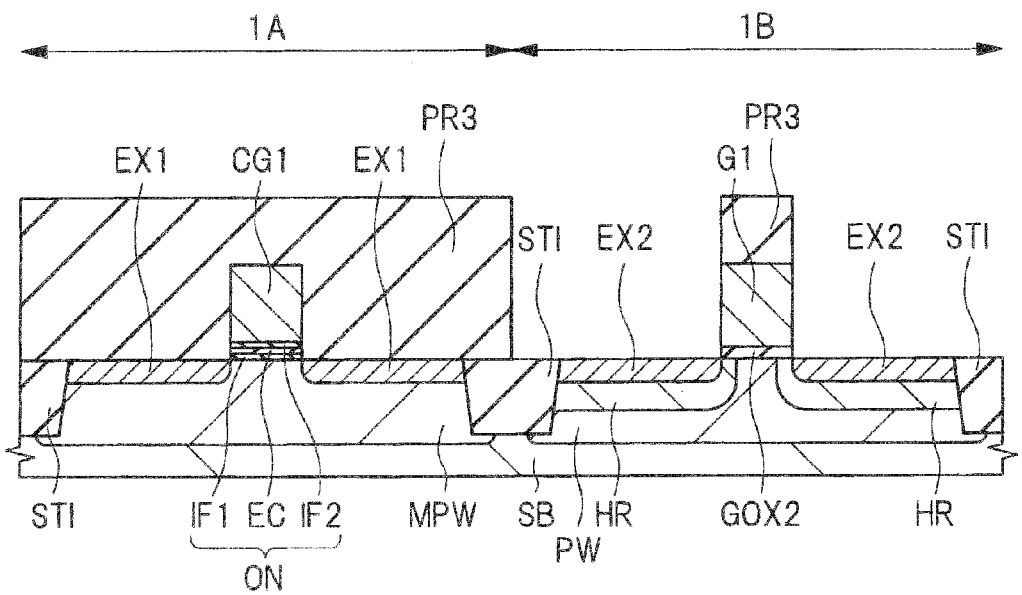
FIG. 10 is a sectional view of the semiconductor device during the manufacturing process following FIG. 9.

Subsequently, as illustrated in FIG. 10, extension regions (n⁻ semiconductor regions, low-concentration impurity diffusion regions) EX2 matched with the gate electrode G1 are formed in the semiconductor substrate SB in the peripheral circuit region 1B by an ion implantation process with the patterned resist film PR3 as a mask (step S107 in FIG. 1).

Each halo region HR is terminated at a position close to the region directly below the above-described center in the gate length direction of the gate electrode G1 compared with the extension region EX2. Moreover, the halo region HR is formed deeper than the extension region EX2. The halo regions HR may be formed after formation of the extension regions EX2.

Figure 11:
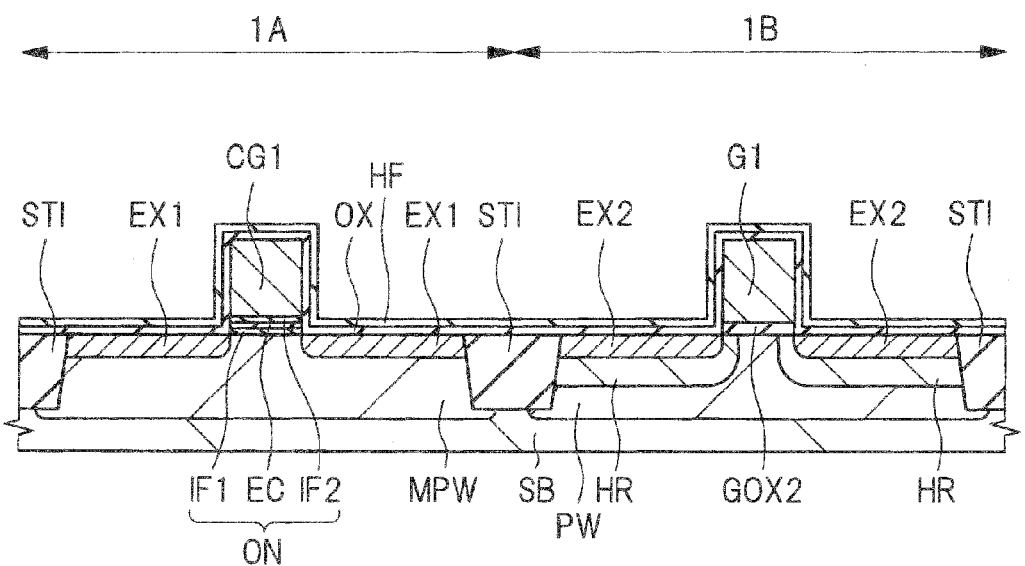
FIG. 11 is a sectional view of the semiconductor device during the manufacturing process following FIG. 10.

Subsequently, as illustrated in FIG. 11, the patterned resist film PR3 is removed, and then an insulating film OX and a hydrogen-containing insulating film HF are formed in this order by, for example, a CVD process over the entire main surface of the semiconductor substrate SB (step S108 in FIG. 1). The insulating film OX is composed of, for example, a silicon oxide film. The hydrogen-containing insulating film HF is composed of a silicon nitride film containing a relatively large amount of hydrogen (H). Consequently, the side walls and the upper surface of the stacked film, which includes the ONO film ON as a gate insulating film and the gate electrode CG1, are covered with the insulating film OX and the hydrogen-containing insulating film HF in this order. The stacked film including the insulating film GOX2 and the gate electrode G1 is also in sequence covered with the insulating film OX and the hydrogen-containing insulating film HF. The hydrogen-containing insulating film HF has a hydrogen content of $1 \times 10^{21}$/cm³ or more, for example.

Figure 12:
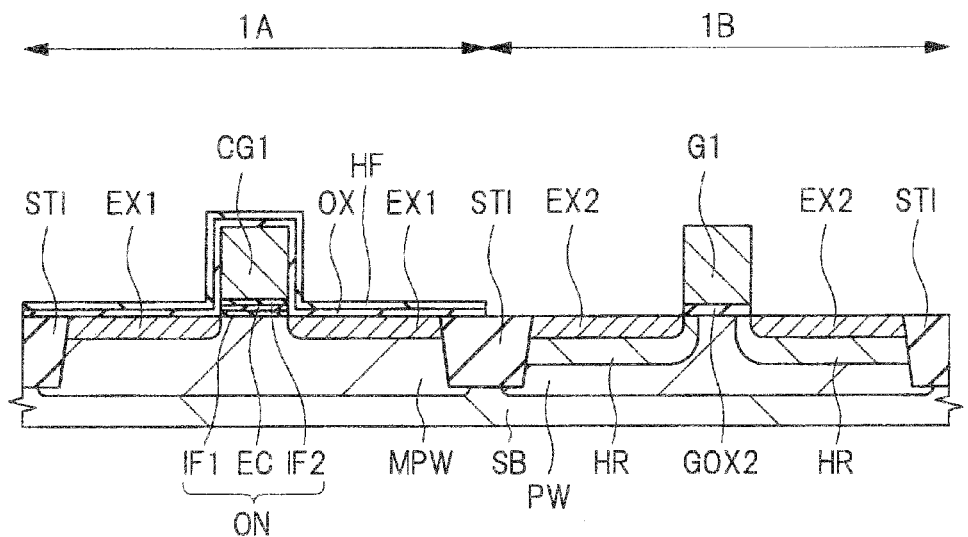
FIG. 12 is a sectional view of the semiconductor device during the manufacturing process following FIG. 11.

Subsequently, as illustrated in FIG. 12, the hydrogen-containing insulating film HF and the insulating film OX in the peripheral circuit region 1B are removed by a photolithography technique and an etching process (step S109 in FIG. 1). Consequently, the main surface of the semiconductor substrate SB and the stacked film including the insulating film GOX2 and the gate electrode G1 are exposed from the hydrogen-containing insulating film HF and the insulating film OX in the peripheral circuit region 1B. Since the insulating film OX and the hydrogen-containing insulating film HF in the memory cell region 1A are not removed and thus remains therein, the stacked film including the ONO film ON and the gate electrode CG1 is still covered with the insulating film OX and the hydrogen-containing insulating film HF in this order. In such a removal step, the insulating film OX protects the semiconductor elements covered with the insulating film OX during removal of the hydrogen-containing insulating film HF.

Subsequently, the semiconductor wafer composed of the semiconductor substrate SB is heat-treated (step S110 in FIG. 1). The heat treatment is performed in an inert-gas atmosphere rather than the hydrogen atmosphere. Consequently, hydrogen (H) in the hydrogen-containing insulating film HF is diffused and introduced into an interface between the ONO film ON and the semiconductor substrate SB. Specifically, the hydrogen is introduced into a region where the bottom of the ONO film ON, i.e., the bottom of the insulating film IF1, is in contact with the main surface of the semiconductor substrate SB. Such a step (hereinafter, simply referred to as hydrogen anneal in some case), in which hydrogen is introduced through the heat treatment into the interface between the gate insulating film and the semiconductor substrate SB in the memory cell region, is performed to solve the following problems.

Specifically, a defect such as a dangling bond occurs due to a process of impurity implantation or etching at an interface between the insulating film (lower insulating film) IF1 at the bottom of the ONO film ON and the semiconductor substrate SB. If hydrogen anneal is not performed, the intrinsic interfacial defect, which occurs at the interface during film formation or another process, directly remains in the interface, leading to an extremely large number of interfacial defects. Such a large number of interfacial defects increases resistance of the memory cell, resulting in an extremely low ON current. In addition, threshold variation occurs due to charge trapping at the interfacial defect of the memory cell. In this way, the interfacial defect is significantly disadvantageous in the memory cell configuring the nonvolatile memory compared with the low-withstand-voltage MISFET in the peripheral circuit region 1B.

Hence, the interfacial defect must be repaired by the hydrogen anneal particularly in the memory cell. The hydrogen anneal is thus a technique of hydrogen termination of the defect at the interface between the gate insulating film and the substrate of the transistor. In the first embodiment, the interfacial defect is repaired by hydrogen anneal as heat treatment performed after formation of the hydrogen-containing insulating film HF that covers the gate electrode G1 and the ONO film ON in the memory cell region 1A and exposes the peripheral circuit region 1B. This prevents lowering of ON current of the memory cell to be formed in a later step and lowers the resistance of the memory cell, and thus improves performance of the semiconductor device. The hydrogen anneal may be combined with heat treatment that activates the impurity introduced into the semiconductor substrate SB and the structure on the semiconductor substrate SB.

Figure 13:
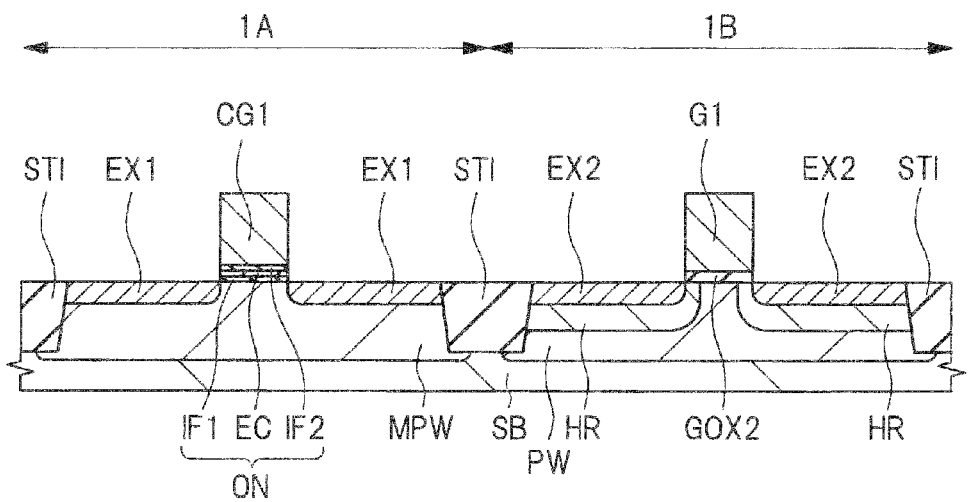
FIG. 13 is a sectional view of the semiconductor device during the manufacturing process following FIG. 12.

Subsequently, as illustrated in FIG. 13, the hydrogen-containing insulating film HF and the insulating film OX are removed by, for example, a wet etching process, and then a stacked film including a silicon oxide film, a silicon nitride film, and a silicon oxide film is formed on the semiconductor substrate SB. Each of the silicon oxide film and the silicon nitride film can be formed by a CVD process, for example. Subsequently, sidewalls SW are formed through anisotropic etching of the stacked film (step S111 in FIG. 1). Specifically, the upper surfaces of the semiconductor substrate SB and the gate electrodes CG1 and G1 are each exposed from the silicon oxide film and the silicon nitride film. In such a removal step, the insulating film OX protects the elements formed in the memory cell region 1A and the peripheral circuit region 1B during removal of the hydrogen-containing insulating film HF.

Specifically, in the memory cell region 1A, the sidewalls SW are formed on side walls on both sides of the stacked film including the gate electrode CG1 and the ONO film ON. In the peripheral circuit region 1B, the sidewalls SW are formed on side walls on both sides of the gate electrode G1. For better understanding of the drawing, FIG. 13 collectively illustrates the silicon oxide film and the silicon nitride film in a form of one film, and omits illustration of the boundary between the silicon oxide film and the silicon nitride film.

Figure 14:
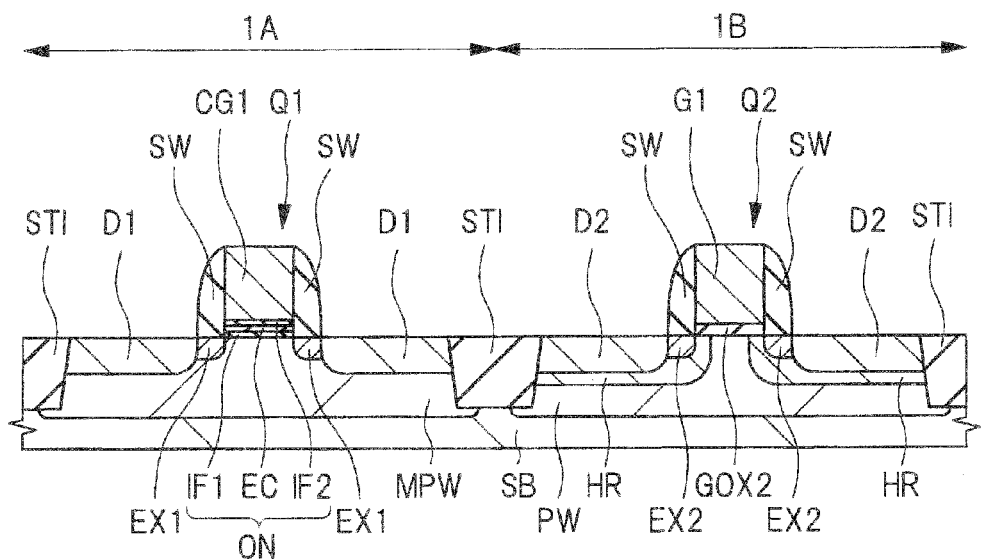
FIG. 14 is a sectional view of the semiconductor device during the manufacturing process following FIG. 13.

Subsequently, as illustrated in FIG. 14, diffusion regions (n$^+$ semiconductor regions, high-concentration impurity diffusion regions) D1 matched with the sidewalls SW are formed in the memory cell region 1A by a photolithography technique and an ion implantation process (step S112 in FIG. 1). The diffusion regions D1 are each a semiconductor region that contains an n-type impurity such as phosphorus or arsenic introduced at a concentration higher than the extension region EX1. The pair of diffusion regions D1 are thus formed on the main surface of the semiconductor substrate SB on both sides of the gate electrode CG1. The depth of each diffusion region D1 is deeper than each of the pair of extension regions EX1 and shallower than the element isolation region STI and the p-type well MPW. The diffusion region D1 and the extension region EX1 configure the source or drain region of the MONOS memory.

Subsequently, heat treatment is performed to diffuse the impurity introduced in the semiconductor substrate SB or the like. The heat treatment can be performed using a heat treatment chamber used in the hydrogen anneal described with reference to FIG. 12.

In this way, each of the source and drain regions of the MONOS memory is formed of the diffusion region D1 and the extension region EX1, thereby the source and drain regions of the MONOS memory are each allowed to have a lightly doped drain (LDD) structure. Consequently, a memory cell Q1 of the MONOS memory, which includes the source/drain regions each including the diffusion region D1 and the extension region EX1, the ONO film ON, and the gate electrode CG1, are formed in the memory cell region 1A.

In the peripheral circuit region 1B, diffusion regions (n$^+$ semiconductor regions, high-concentration impurity diffusion region) D2 matched with the sidewalls SW are also formed by a similar ion implantation step (step S112 in FIG. 1). The diffusion region D2 and the extension region EX2 configure the source or drain region of the low-withstand-voltage MISFET.

In this way, each of the source and drain regions of the low-withstand-voltage MISFET is formed of the diffusion region D2 and the extension region EX2, and is thereby also allowed to have the LDD structure. Consequently, a low-withstand-voltage MISFET TQ2, which includes the source/drain regions each including the diffusion region D2 and the extension region EX2, the insulating film GOX2 as a gate insulating film, and the gate electrode G1, is formed in the peripheral circuit region 1B.

Figure 15:
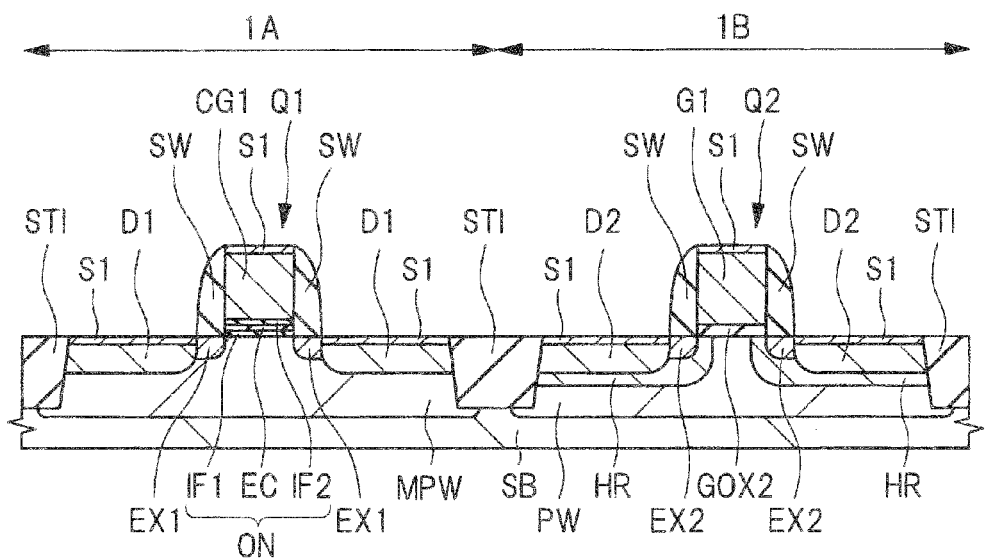
FIG. 15 is a sectional view of the semiconductor device during the manufacturing process following FIG. 14.

Subsequently, as illustrated in FIG. 15, a nickel platinum film (NiPt film) is formed on the semiconductor substrate SB and then heat-treated. In the memory cell region 1A, the polysilicon film configuring the gate electrode CG1 is thereby reacted with the nickel platinum film, so that a silicide layer S1 composed of a nickel platinum silicide film (NiPtSi film) is formed. Silicon is also reacted with the nickel platinum film to form the silicide layer S1 on the surface of each diffusion region D1.

In the peripheral circuit region 1B, the silicide layer S1 composed of the nickel platinum silicide film is also formed on the upper surface of the gate electrode G1. Silicon is also reacted with the nickel platinum film to form the silicide layer S1 composed of the nickel platinum silicide film on the surface of each diffusion region D2.

Although the first embodiment is described on the case of forming the nickel platinum silicide film, another silicide film such as a cobalt silicide film, a nickel silicide film, a titanium silicide film, or a platinum silicide film may be formed in place of the nickel platinum silicide film.

Figure 16:
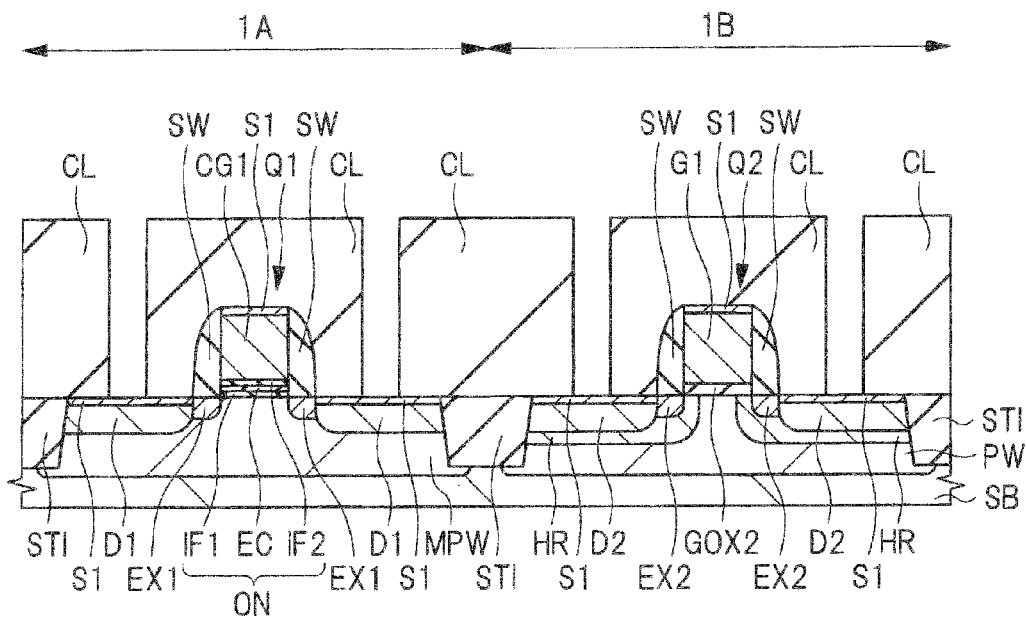
FIG. 16 is a sectional view of the semiconductor device during the manufacturing process following FIG. 15.

Subsequently, as illustrated in FIG. 16, an undepicted etching stopper film composed of a silicon nitride film is formed on the main surface of the semiconductor substrate SB, and then an interlayer insulating film CL composed of a silicon oxide film is formed on the silicon nitride film. Subsequently, the upper surface of the interlayer insulating film CL is planarized by, for example, chemical mechanical polishing (CMP). Subsequently, a plurality of contact holes are formed in the interlayer insulating film CL by a photolithography technique and a dry etching technique. The undepicted silicon nitride film is used as an etching stopper film for opening the contact holes. Each of the contact holes penetrates through the interlayer insulating film CL and the silicon nitride film, and exposes the upper surface of each silicide layer S1.

Figure 17:
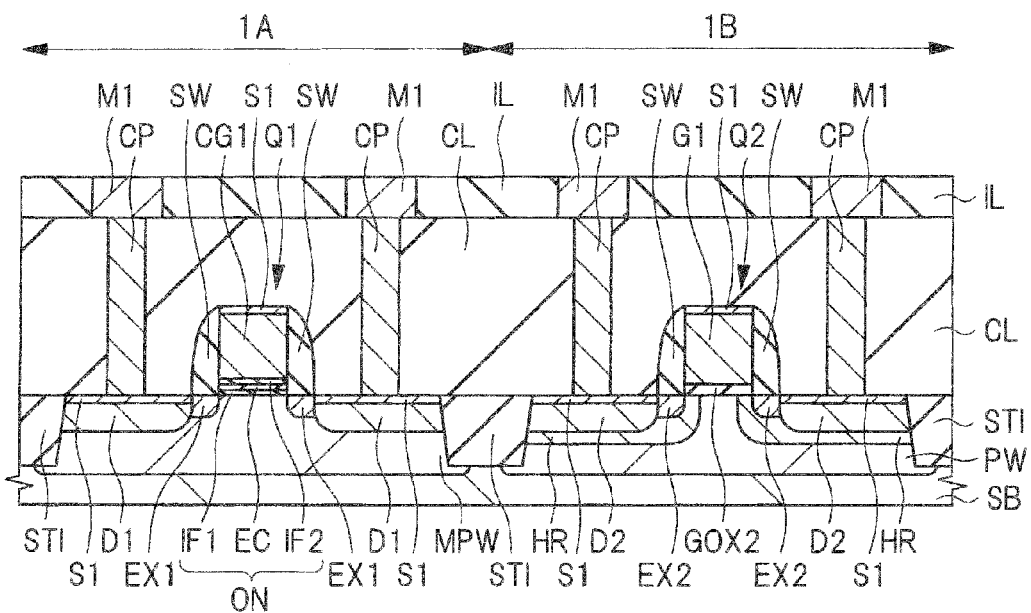
FIG. 17 is a sectional view of the semiconductor device during the manufacturing process following FIG. 16.

Subsequently, as illustrated in FIG. 17, a titanium/titanium nitride film is formed on the interlayer insulating film CL including the bottom and the inner wall of each contact hole. The titanium/titanium nitride film is composed of a stacked film including a titanium film and a titanium nitride film, and can be formed by a sputtering process, for example. For example, the titanium/titanium nitride film prevents diffusion of tungsten as a material for a film that fills the contact holes in a subsequent step, i.e., has so-called barrier properties.

A tungsten film is formed over the entire main surface of the semiconductor substrate SB so as to fill the contact holes. The tungsten film can be formed by a CVD process, for example. The unnecessary titanium/titanium nitride film and tungsten film on the interlayer insulating film CL are removed by CMP, for example. This results in formation of contact plugs CP composed of the titanium/titanium nitride film and the tungsten film filling the respective contact holes.

Each contact plug CP is coupled to one of the diffusion regions D1 and D2 with the silicide layer S1 in between. In the undepicted region, each contact plug CP is coupled to one of the tops of the gate electrode CG1 and the gate electrode G1 with the silicide layer S1 in between.

Subsequently, an interlayer insulating film IL composed of, for example, a silicon oxide film is formed over the contact plugs CP and the interlayer insulating film CL. A plurality of interconnection trenches penetrating through the interlayer insulating film IL are formed by a photolithography technique and an etching technique. The upper surface of the interlayer insulating film CL and the upper surface of contact plug CP are exposed on the bottom of each interconnection trench.

Subsequently, a tantalum/tantalum nitride film is formed over the interlayer insulating film IL and on the inside of each interconnection trench. The tantalum/tantalum nitride film can be formed by, for example, a sputtering process. Subsequently, a seed film composed of a thin copper film is formed over the tantalum/tantalum nitride film by, for example, a sputtering process, and then a copper film is formed on the interlayer insulating film IL having the interconnection trenches by an electroplating process with the seed film as an electrode. Subsequently, the copper film exposed on the interlayer insulating film IL is removed through polishing by, for example, CMP except for the copper film within each of the interconnection trenches, so that the copper film is left only within each of the interconnection trenches in the interlayer insulating film IL.

This results in formation of interconnections M1 mainly including the copper films filled within the interconnection trenches. While an interconnection is further formed over each interconnection M1, description of that is omitted. In this way, the semiconductor device of the first embodiment can be formed.

Operation of Nonvolatile Memory

The semiconductor device of the first embodiment is configured as described above. Operation of the memory cell (nonvolatile memory cell) Q1 included in the semiconductor device as illustrated in FIG. 17 is now described.

First, erase operation is described. For the erase operation, the electric potential of the p-type well MPW of a selected memory cell is adjusted to 1.5 V, the electric potential of the gate electrode CG1 coupled to a word line is adjusted to −8.5 V, and the electric potential of the source region of the memory cell Q1 coupled to a source line is adjusted to 1.5 V. Charge stored in the charge storage film EC of the memory cell Q1 is thereupon extracted to a semiconductor substrate SB side, so that data is erased.

Subsequently, write operation is described. For the write operation, the electric potential of a selected p-type well MPW is adjusted to −10.5 V, the electric potential of the gate electrode CG1 coupled to the word line is adjusted to 1.5 V, and the electric potential of the source region of the memory cell Q1 coupled to the source line is adjusted to −10.5 V. Charge is thereupon injected into the charge storage film EC of the memory cell Q1, so that data is written. Such charge injection is performed by a method using FN tunneling (FN charge injection method).

Subsequently, read operation is described. For example, a memory cell Q1, to which information (data) has been written, has data "1", i.e., the transistor (memory cell Q1) has a high threshold voltage. A memory cell Q1, from which information has been erased, has data "0", i.e., the transistor (memory cell Q1) has a low threshold voltage. For reading data from the memory cell Q1, the electric potential of a selected p-type well MPW is adjusted to −2 V, the electric potential of the gate electrode CG1 is adjusted to 0 V, and the electric potential of the source region is adjusted to 0 V. The data is thereupon read from the selected memory cell Q1.

In this case, the memory cell Q1 that retains the received information has a high threshold voltage, while the memory cell Q1, from which information is erased, has a low threshold voltage. This results in a constant electric potential of a data line coupled to the drain region of the memory cell Q1 that retains the received information, and results in a decrease in electric potential of a data line coupled to the drain region of the memory cell Q1 from which information is erased. Such a variation in potential of the data line is detected, thereby presence of information is determined, and consequently information is read.

In the first embodiment, hydrogen termination at the interface between the gate insulating film and the semiconductor substrate SB is most effective when the FN charge injection method is used for write operation and erase operation of the memory cell Q1. When charge is injected by the FN charge injection method, the charge is less effective in dissociating the hydrogen terminated at the interfacial defect between the semiconductor substrate SB and the ONO film ON. Hence, even if the write and erase operations are repeated, the effect of hydrogen termination can be maintained.

When the hot-carrier injection method is used, terminated hydrogen is easily dissociated due to high-energy charge. As a result, the number of interfacial defects increases with repetition of write operation and erase operation, which disadvantageously increases ON resistance of the memory cell. Hence, hydrogen termination through hydrogen anneal is actually less effective.

For the hot-carrier injection method, electron and/or hole are/is provably injected as the charge. In particular, when the band-to-band tunneling (BTBT) method is used as the hot-carrier injection method so that hot hole is injected, the number of interfacial defects significantly increases compared with hot-electron injection. Hence, the effect of hydrogen termination is less likely to be exhibited. When hot electron is injected by a source side injection (SSI) method, the number of interfacial defects does not significantly increase compared with hot-hole injection. Hence, a certain effect of hydrogen termination is exhibited.

Characteristic Features of First Embodiment

The effects of the method of manufacturing the semiconductor device of the first embodiment are now described in comparison with a semiconductor device of a comparative example. The semiconductor device of the comparative example is manufactured through steps similar to the steps described with reference to FIGS. 1 to 17. However, hydrogen anneal is performed through heat treatment in a hydrogen atmosphere instead of the hydrogen anneal step with the hydrogen-containing insulating film HF described with reference to FIGS. 11 and 12 (steps S108 to S110 in FIG. 1).

Specifically, for the semiconductor device of the comparative example, first, the ONO film ON, the insulating film GOX2, the gate electrodes CG1 and G1, the extension regions EX1 and EX2, and the halo regions HR are formed through steps similar to those described with reference to FIGS. 2 to 10. Subsequently, a semiconductor wafer composed of the semiconductor substrate SB is placed in a chamber, and the semiconductor wafer is heat-treated while the atmosphere in the chamber is adjusted to a hydrogen atmosphere. The hydrogen anneal is thus performed to repair a defect at the interface between the semiconductor substrate SB and the gate insulating film. Thereafter, steps similar to those described with reference to FIGS. 13 to 17 are performed to form the semiconductor device of the comparative example.

The semiconductor device of the comparative example has the following difficulties. Specifically, when the MISFET in the peripheral circuit is provided together with the memory cell of the nonvolatile memory as in the semiconductor device of the comparative example, property variation occurs in the semiconductor element on the semiconductor substrate. Moreover, an additional apparatus such as the above-described chamber must be installed, leading to an increase in manufacturing process cost of the semiconductor device.

The property variation in the semiconductor device during hydrogen anneal in a hydrogen atmosphere is caused by, for example, a deactivation phenomenon of boron (B) due to the hydrogen anneal. For the p-channel MISFET provided in the peripheral circuit region, when hydrogen anneal is performed in a hydrogen atmosphere, boron injected into the gate electrode or the diffusion region is deactivated. Hence, depletion occurs in the gate electrode, and resistance between the source and drain regions increases. For the n-channel MISFET provided in the peripheral circuit region 1B, its short-channel characteristics are degraded through deactivation of boron introduced in the halo region.

In the first embodiment, therefore, hydrogen anneal is performed while the hydrogen-containing insulating film HF illustrated in FIG. 12 is selectively formed instead of the hydrogen anneal in a hydrogen atmosphere, so that property variation caused by deactivation of boron is prevented in the semiconductor element configuring CMOS in the peripheral circuit region as described above.

As described with reference to FIGS. 11 and 12, the hydrogen-containing insulating film HF can be formed using an apparatus used in deposition of another insulating film or the like. The heat treatment for the hydrogen anneal can be performed using an annealing apparatus for activating the source/drain regions. The hydrogen-containing insulating film HF can be removed using an etching apparatus used in removal of another insulating film. The hydrogen anneal in the first embodiment can therefore be performed using existing apparatuses. This eliminates the need of provision of an additional heat treatment chamber for hydrogen anneal in a hydrogen atmosphere. Consequently, manufacturing cost of the semiconductor device can be reduced.

In the first embodiment, since hydrogen anneal in a hydrogen atmosphere is not performed, deactivation of boron can be prevented in the semiconductor element configuring CMOS in the peripheral circuit region 1B. This is because hydrogen anneal is performed after removing the hydrogen-containing insulating film HF in the peripheral circuit region 1B as described with reference to FIG. 12. This makes it possible to repair a defect at the interface between the ONO film ON as the gate insulating film and the semiconductor substrate SB in the memory cell region 1A, and to prevent deactivation of boron in the peripheral circuit region 1B. Hence, even if the element configuring the peripheral circuit is provided together with the nonvolatile memory, it is possible to prevent property variation in the semiconductor element in the peripheral circuit region 1B. Consequently, performance of the semiconductor device can be improved.

Specifically, for the p-channel MISFET provided in the peripheral circuit region 1B, it is possible to prevent depletion in the gate electrode and an increase in resistance between the source region and the drain region. For the n-channel MISFET provided in the peripheral circuit region 1B, since boron introduced in the halo region HR can be prevented from being deactivated, the short-channel characteristics can be prevented from being degraded. In the first embodiment, the heat treatment (hydrogen anneal) is performed while the semiconductor element is covered with the silicon nitride film in the memory cell region 1A. The silicon nitride film mentioned herein refers to the hydrogen-containing insulating film HF provided in the memory cell region 1A. Consequently, the memory cell Q1 receives stress from the silicon nitride film during the heat treatment; hence, mobility of charge can be improved.

Second Embodiment

Figure 18:
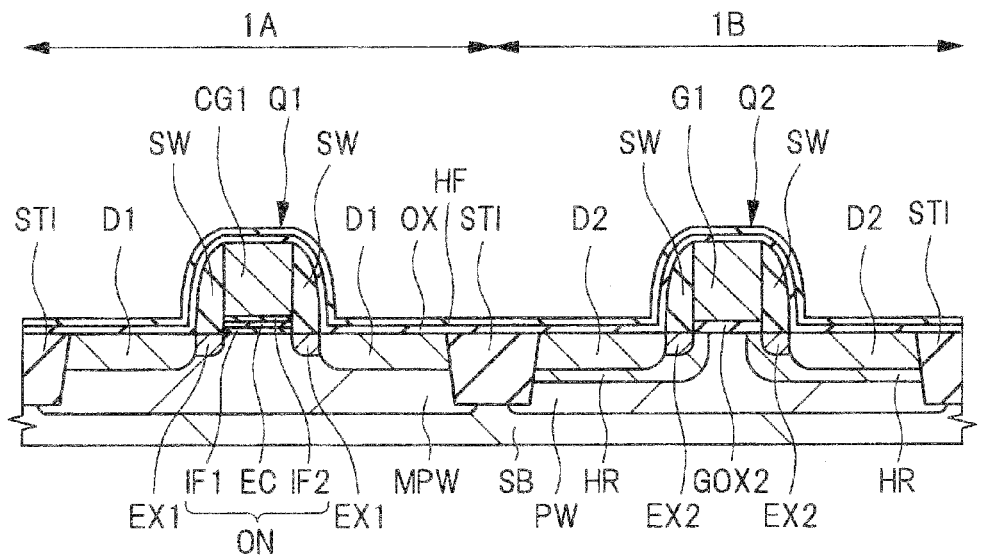
FIG. 18 is a sectional view of a semiconductor device of a second embodiment during a manufacturing process of the semiconductor device.
Figure 19:
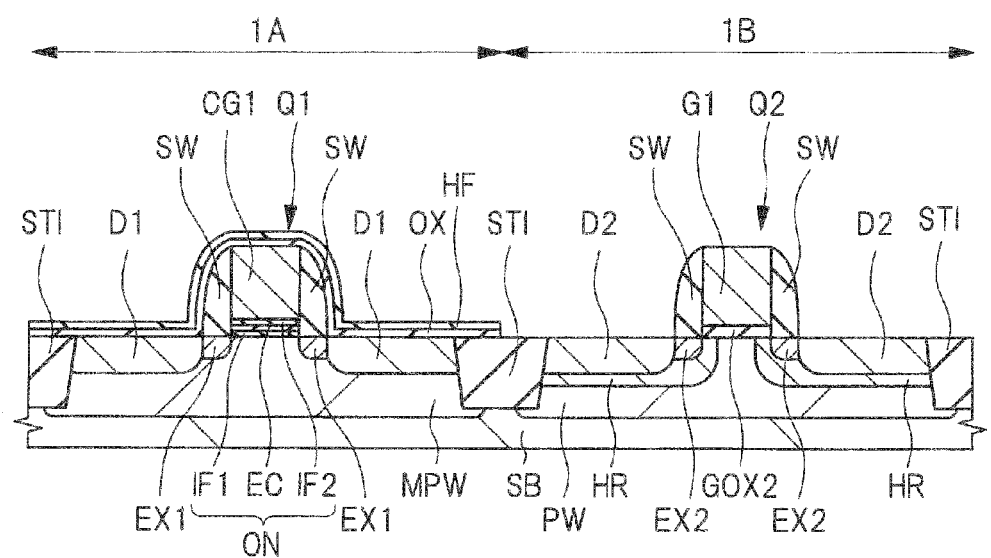
FIG. 19 is a sectional view of the semiconductor device during the manufacturing process following FIG. 18.

A method of manufacturing a semiconductor device according to a second embodiment, in which hydrogen anneal is performed after formation of the diffusion regions configuring the source/drain regions of the transistor, is now described with reference to FIGS. 18 and 19. FIGS. 18 and 19 are each a sectional view of the semiconductor device of the second embodiment during a manufacturing process of the semiconductor device. Each of FIGS. 18 and 19 also illustrates the memory cell region 1A on its left side and the peripheral circuit region 1B on its right side.

In the second embodiment, first, the memory cell Q1 and the low-withstand-voltage MISFET TQ2 are formed on the semiconductor substrate SB through steps similar to those described with reference to FIGS. 1 to 10, 13, and 14. Specifically, the formation step of the extension regions EX2 is performed as described with reference to FIG. 10, and then the sidewalls SW (see FIG. 13) and the diffusion regions D1 and D2 (see FIG. 14) are successively formed while the steps described with reference to FIGS. 11 and 12 are not performed.

Subsequently, as illustrated in FIG. 18, the insulating film OX and the hydrogen-containing insulating film HF are formed in this order by, for example, a CVD process over the entire main surface of the semiconductor substrate SB. The insulating film OX is composed of, for example, a silicon oxide film. The hydrogen-containing insulating film HF is composed of a silicon nitride film containing a relatively large amount of hydrogen. Consequently, the upper surface of the stacked film including the ONO film ON as the gate insulating film and the gate electrode CG1, the surfaces of the sidewalls SW on the side walls of the stacked film, and the upper surfaces of the diffusion regions D1 are covered with the insulating film OX and the hydrogen-containing insulating film HF in this order. The stacked film including the insulating film GOX2 and the gate electrode G1, the sidewalls SW on the side walls of the stacked film, and the upper surfaces of the diffusion regions D2 are also covered with the insulating film OX and the hydrogen-containing insulating film HF. The hydrogen-containing insulating film HF has a hydrogen content of $1 \times 10^{21}/cm^3$ or more, for example.

Subsequently, as illustrated in FIG. 19, the hydrogen-containing insulating film HF and the insulating film OX in the peripheral circuit region 1B are removed by a photolithography technique and an etching process. Consequently, the main surface of the semiconductor substrate SB in the peripheral circuit region 1B, the stacked film including the insulating film GOX2 and the gate electrode G1, and the sidewalls SW are exposed from the hydrogen-containing insulating film HF and the insulating film OX. Since the hydrogen-containing insulating film HF and the insulating film OX in the memory cell region 1A are not removed and thus remains therein, the stacked film including the ONO film ON and the gate electrode CG1, the sidewalls SW on the side walls of the stacked film, and the diffusion regions D1 are still covered with the insulating film OX and the hydrogen-containing insulating film HF.

Subsequently, the semiconductor wafer including the semiconductor substrate SB is heat-treated. Consequently, hydrogen (H) in the hydrogen-containing insulating film HF is introduced into the interface between the ONO film ON and the semiconductor substrate SB. Specifically, the hydrogen is introduced into a region where the bottom of the ONO film ON, i.e., the bottom of the insulating film IF1, is in contact with the main surface of the semiconductor substrate SB. Hydrogen anneal is thus performed, and thereby a defect at an interface between the insulating film IF1 and the semiconductor substrate SB can be repaired.

In the second embodiment, hydrogen anneal is performed after formation of the respective diffusion regions D1 and D2 of the memory cell Q1 and the low-withstand-voltage MISFET TQ2. Hence, the impurity introduced in the source/drain regions may be diffused through the hydrogen anneal. In other words, hydrogen anneal and diffusion anneal can be collectively performed through one heat treatment step. This simplifies the manufacturing process of the semiconductor device.

Subsequently, the hydrogen-containing insulating film HF and the insulating film OX are removed by, for example, a wet etching process, and then a semiconductor device having a configuration similar to that of the semiconductor device illustrated in FIG. 17 is formed through steps similar to those described with reference to FIGS. 15 to 17.

As described above, in the method of manufacturing the semiconductor device of the second embodiment, the steps S108 to S110 illustrated in FIG. 1 are performed following the step S112. Specifically, when the hydrogen anneal with the hydrogen-containing insulating film HF (see FIG. 19) is performed after formation of the sidewalls SW and the diffusion regions D1 and D2 as in the second embodiment, effects similar to those in the first embodiment can also be provided.

The hydrogen anneal is performed in order to repair an interfacial defect occurring during a process; hence, the hydrogen anneal is desirably performed in a later step (after formation of the memory cell and the peripheral circuit transistor), if possible. While the number of defects at the interface between the gate insulating film of the memory cell Q1 and the semiconductor substrate SB increases through the formation steps of the sidewalls SW and the diffusion regions D1 and D2, the second embodiment allows such defects to be repaired. Consequently, it is possible to further decrease the number of interfacial defects in the memory cell Q1 in the completed semiconductor device compared with the first embodiment.

Third Embodiment

Figure 20:
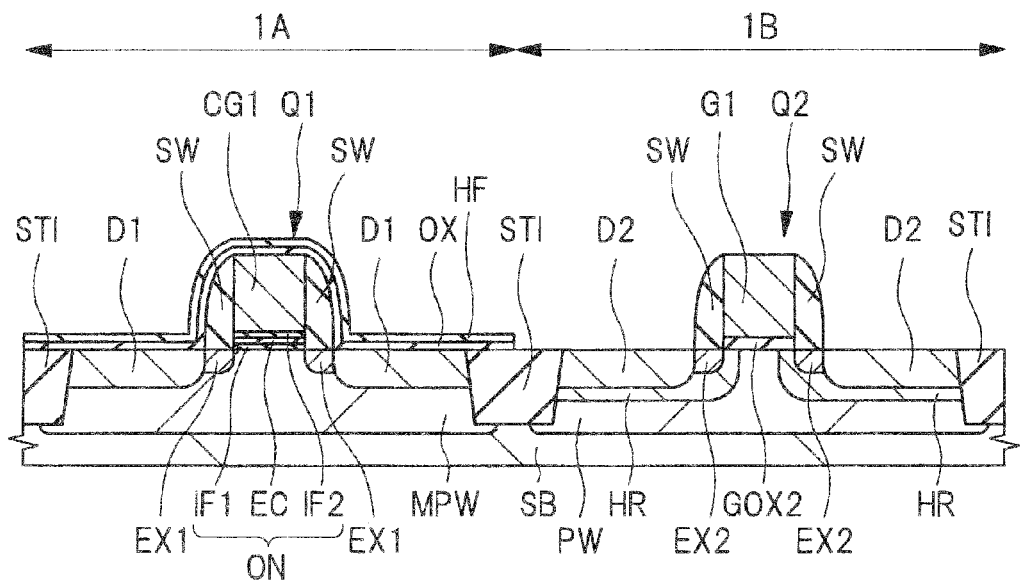
FIG. 20 is a sectional view of a semiconductor device of a third embodiment during a manufacturing process of the semiconductor device.
Figure 21:
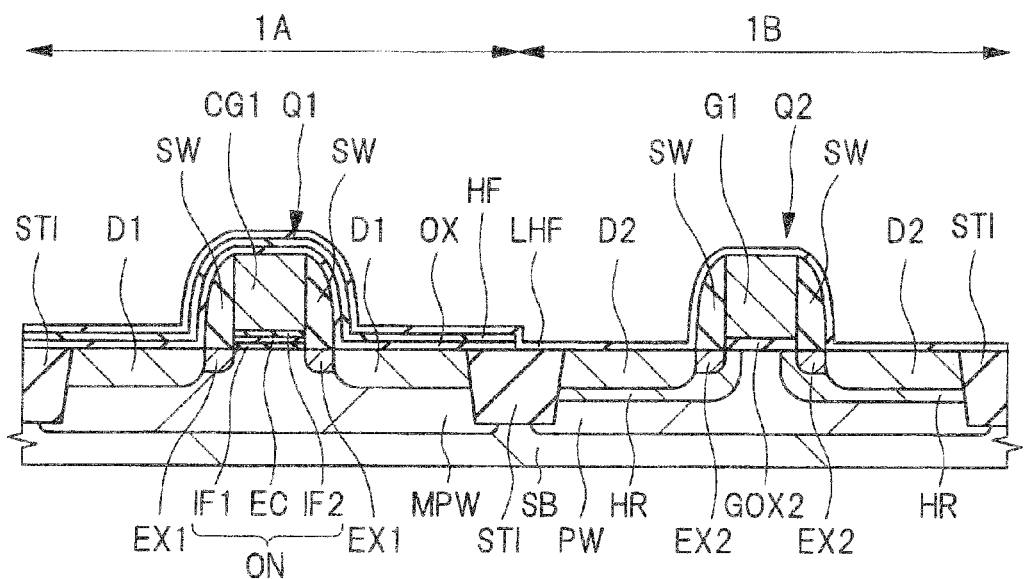
FIG. 21 is a sectional view of the semiconductor device during the manufacturing process following FIG. 20.

It is now described with reference to FIGS. 20 and 21 that hydrogen anneal is performed with a hydrogen-containing insulating film having a high hydrogen concentration and a hydrogen-containing insulating film having a low hydrogen concentration. FIGS. 20 and 21 are each a sectional view of a semiconductor device of a third embodiment during a manufacturing process of the semiconductor device. Each of FIGS. 20 and 21 also illustrates the memory cell region 1A on its left side and the peripheral circuit region 1B on its right side.

In the third embodiment, first, steps similar to those in the second embodiment are performed to produce the structure illustrated in FIG. 18. Specifically, the memory cell Q1 and the low-withstand-voltage MISFET TQ2 are formed on the semiconductor substrate SB without hydrogen anneal, and then the insulating film OX and the hydrogen-containing insulating film HF are formed in this order on the semiconductor substrate SB.

Subsequently, as illustrated in FIG. 20, the hydrogen-containing insulating film HF and the insulating film OX in the peripheral circuit region 1B are removed by a photolithography technique and an etching process. Consequently, the main surface of the semiconductor substrate SB in the peripheral circuit region 1B, the stacked film including the insulating film GOX2 and the gate electrode G1, and the sidewalls SW are exposed from the hydrogen-containing insulating film HF and the insulating film OX. Since the hydrogen-containing insulating film HF and the insulating film OX in the memory cell region 1A are not removed and thus remains therein, the stacked film including the ONO film ON and the gate electrode CG1, the sidewalls SW on the side walls of the stacked film, and the diffusion regions D1 are still covered with the insulating film OX and the hydrogen-containing insulating film HF.

Subsequently, as illustrated in FIG. 21, a hydrogen-containing insulating film LHF is formed over the entire main surface of the semiconductor substrate SB by, for example, a CVD process. The hydrogen-containing insulating film LHF contains a relatively small amount of hydrogen, and is composed of, for example, a silicon nitride film. Consequently, the upper surface of the stacked film including the ONO film ON as the gate insulating film and the gate electrode CG1, the surfaces of the sidewalls SW on the side walls of the stacked film, the upper surfaces of the diffusion regions D1, and the hydrogen-containing insulating film HF are covered with the hydrogen-containing insulating film LHF. The stacked film including the insulating film GOX2 and the gate electrode G1, the sidewalls SW on the side walls of the stacked film, and the upper surfaces of the diffusion regions D2 are also covered with the hydrogen-containing insulating film LHF. The hydrogen-containing insulating film LHF has a hydrogen content of less than $1\times10^{21}/cm^3$, for example.

In other words, the hydrogen-containing insulating film LHF has a hydrogen content lower than that of the hydrogen-containing insulating film HF. Specifically, the memory cell Q1 in the memory cell region 1A is covered with a film having a high hydrogen content, while the low-withstand-voltage MISFET TQ2 in the peripheral circuit region 1B is covered with a film having a low hydrogen content.

Subsequently, the semiconductor wafer including the semiconductor substrate SB is heat-treated. Consequently, hydrogen (H) in the hydrogen-containing insulating film HF is introduced into the interface between the ONO film ON and the semiconductor substrate SB. Specifically, the hydrogen is introduced into a region where the bottom of the ONO film ON, i.e., the bottom of the insulating film IF1, is in contact with the main surface of the semiconductor substrate SB. Hydrogen anneal is thus performed, and thereby a defect at an interface between the insulating film IF1 and the semiconductor substrate SB can be repaired.

In this step, hydrogen is provably diffused from the hydrogen-containing insulating film LHF to the MISFET Q2. However, since the hydrogen-containing insulating film LHF has a low hydrogen content, property variation in the semiconductor element due to deactivation of boron can be suppressed even after hydrogen anneal.

Subsequently, the hydrogen-containing insulating films LHF and HF and the insulating film OX are removed by, for example, a wet etching process, and then a semiconductor device having a configuration similar to that of the semiconductor device illustrated in FIG. 17 is formed through steps similar to those described with reference to FIGS. 15 to 17.

The third embodiment provides effects similar to those of the second embodiment.

In the third embodiment, the heat treatment (hydrogen anneal) is performed while the semiconductor element is covered with the silicon nitride film not only in the memory cell region 1A but also in the peripheral circuit region 1B. The silicon nitride film mentioned herein refers to the hydrogen-containing insulating films HF and LHF in the memory cell region 1A, and refers to the hydrogen-containing insulating film LHF in the peripheral circuit region 1B. Consequently, the memory cell Q1 and the low-withstand-voltage MISFET TQ2 each receive stress from the silicon nitride film during the heat treatment; hence, mobility of charge can be improved.

As in the first embodiment, the hydrogen anneal with the hydrogen-containing insulating film HF and the hydrogen-containing insulating film LHF may be performed at timing after formation of the extension regions EX1 and EX2 but before formation of the sidewalls SW and the diffusion regions D1 and D2.

Fourth Embodiment

It is now described with reference to FIGS. 22 to 32 that when the element is formed in the peripheral circuit region by a so-called gate last process, and when a MONOS memory having a split-gate structure is formed, hydrogen anneal is performed with a hydrogen-containing insulating film. FIGS. 22 to 32 are each a sectional view of a semiconductor device of a fourth embodiment during a manufacturing process of the semiconductor device. Each of FIGS. 22 to 32 also illustrates the memory cell region 1A on its left side and the peripheral circuit region 1B on its right side.

Figure 22:
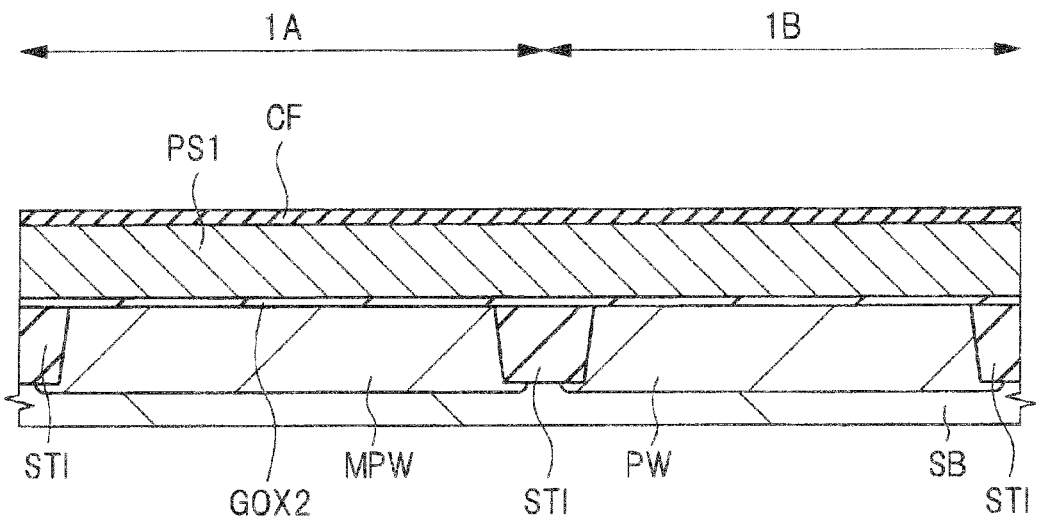
FIG. 22 is a sectional view of a semiconductor device of a fourth embodiment during a manufacturing process of the semiconductor device.

First, as illustrated in FIG. 22, the semiconductor substrate SB is provided, and then element isolation regions STI are formed in trenches provided in the main surface of the semiconductor substrate SB. Subsequently, a p-type impurity (for example, boron (B)) is introduced into the main surface of the semiconductor substrate SB by a photolithography technique and an ion implantation process, thereby the p-type well MPW is formed in the main surface of the semiconductor substrate SB in the memory cell region 1A, and the p-type well PW is formed in the main surface of the semiconductor substrate SB in the peripheral circuit region 1B. Subsequently, the insulating film GOX2, the polysilicon film PS1, and an insulating film (cap insulating film) CF are formed in this order on the main surface of the semiconductor substrate SB.

Figure 23:
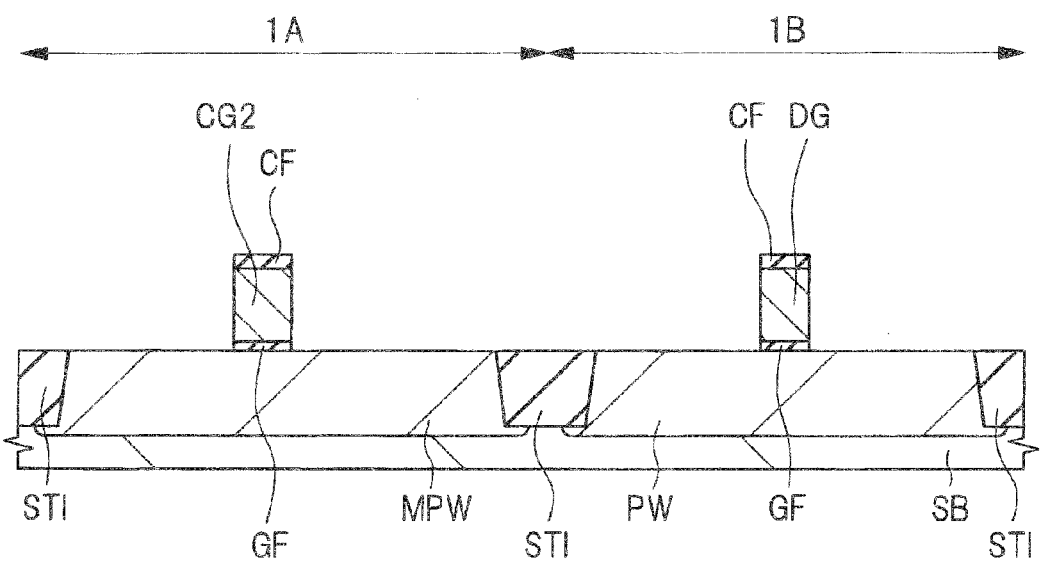
FIG. 23 is a sectional view of the semiconductor device during the manufacturing process following FIG. 22.

Subsequently, as illustrated in FIG. 23, the insulating film CF, the polysilicon film PS1, and the insulating film GOX2 are processed by a photolithography technique and an etching process to expose the main surface of the semiconductor substrate SB. Consequently, a selective gate electrode CG2 composed of the polysilicon film PS1 and an underlying gate insulating film GF composed of the insulating film GOX2 are formed in the memory cell region 1A. Furthermore, through such processing, a dummy gate electrode DG composed of the polysilicon film PS1 and an underlying gate insulating film GF composed of the insulating film GOX2 are formed in the peripheral circuit region 1B.

Figure 24:
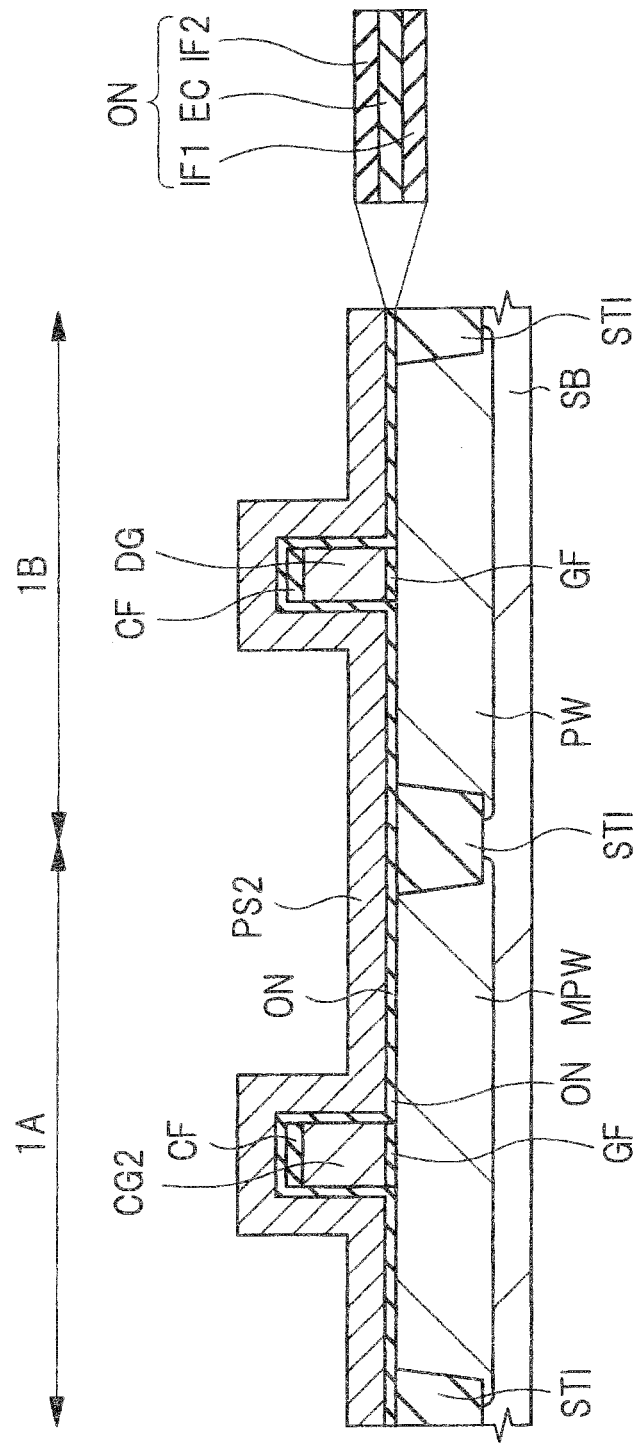
FIG. 24 is a sectional view of the semiconductor device during the manufacturing process following FIG. 23.

Subsequently, as illustrated in FIG. 24, the ONO film ON composed of a stacked film is formed over the semiconductor substrate SB, the stacked film including the insulating film IF1, the charge storage film EC, and the insulating film IF2 stacked in this order. In drawings used in the following description, the ONO film ON having the stacking structure is shown in a form of a single film for simple illustration. Subsequently, the polysilicon film PS2 is formed over the ONO film ON. The ONO film ON is formed by a process similar to that in the first embodiment. The polysilicon film PS2 is formed by a CVD process, for example. The side walls on both sides of each of a first stacked film and a second stacked film and the upper surfaces of such stacked films are covered with the ONO film ON and the polysilicon film PS2, the first stacked film including the gate insulating film GF, the selective gate electrode CG2, and the insulating film CF, the second stacked film including the gate insulating film GF, the dummy gate electrode DG, and the insulating film CF.

Figure 25:
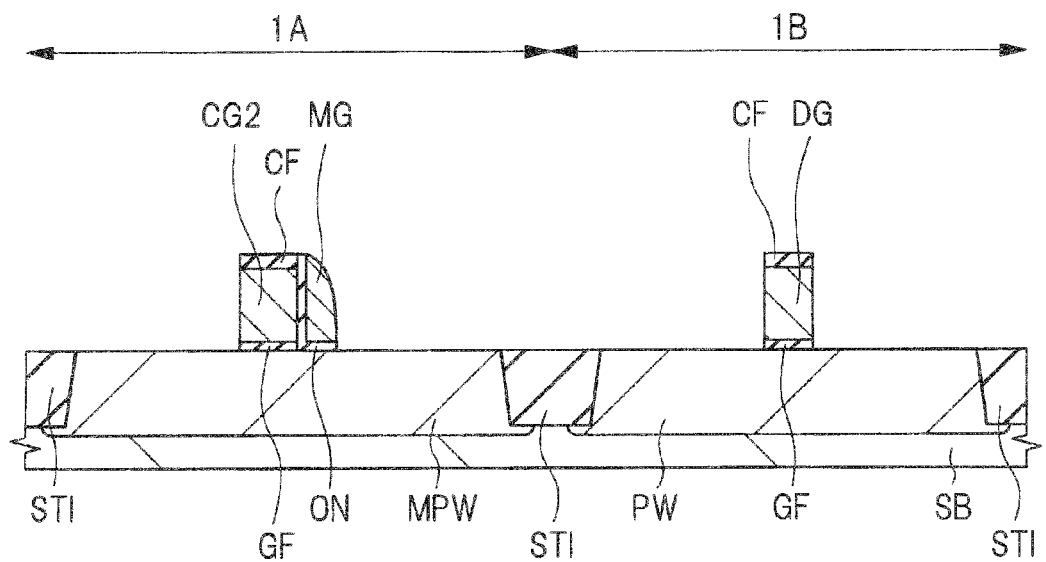
FIG. 25 is a sectional view of the semiconductor device during the manufacturing process following FIG. 24.

Subsequently, as illustrated in FIG. 25, the polysilicon film PS2 is processed through anisotropic etching, and thereby the upper surface of the ONO film ON is partially exposed. Through such processing, the polysilicon film PS2 remains in a self-aligning manner on the side walls on both sides of the selective gate electrode CG2 so as to be next to each side wall with the ONO film ON in between, and has a sidewall shape. The polysilicon film PS2 also remains on the side walls of the dummy gate electrode DG.

Subsequently, the ONO film ON exposed from the sidewall-shaped polysilicon film PS2 is removed, thereby the main surface of the semiconductor substrate SB and the upper surface of the insulating film CF are exposed. Subsequently, while the ONO film ON and the polysilicon film PS2 are partially left while being next to one side wall of the first stacked film in the memory cell region 1A, the ONO film ON and the polysilicon film PS2 in other regions are removed by a photolithography technique and an etching process.

Consequently, a memory gate electrode MG including the polysilicon film PS2 is formed, with the ONO film ON in between, on one side wall of the first stacked film including the selective gate electrode CG2. In other words, the ONO film ON exists between the memory gate electrode MG and the selective gate electrode CG2, and also exists between the memory gate electrode MG and the main surface of the semiconductor substrate SB. Specifically, the ONO film ON has an L-shape section while being continuously provided from a region between the memory gate electrode MG and the selective gate electrode CG2 to a region between the memory gate electrode MG and the main surface of the semiconductor substrate SB. The other side wall of the first stacked film and both side walls of the second stacked film are exposed from the polysilicon film PS2 and the ONO film ON.

Figure 26:
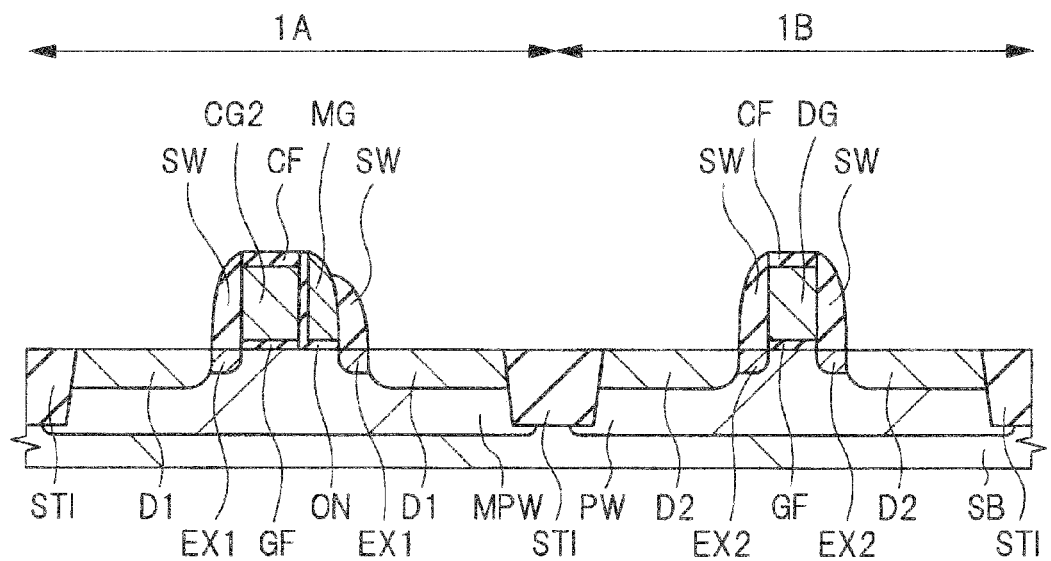
FIG. 26 is a sectional view of the semiconductor device during the manufacturing process following FIG. 25.

Subsequently, as illustrated in FIG. 26, the extension regions EX1 and EX2 and the halo regions are formed in the same way as described with reference to FIGS. 7, 9, and 10. FIG. 26 omits illustration of the pair of halo regions formed in the peripheral circuit region 1B. The extension regions EX1 are formed in pairs across a structure including the first stacked film, the ONO film ON, and the memory gate electrode MG on the main surface of the semiconductor substrate SB on both sides of the structure in the memory cell region 1A. The extension regions EX2 are formed in pairs across the second stacked film on the main surface of the semiconductor substrate SB on both sides of the second stacked film in the peripheral circuit region 1B. The extension regions EX1 and EX2 are each an n-type semiconductor region, while the halo regions are each a p-type semiconductor region.

Subsequently, the sidewalls SW and the diffusion regions D1 and D2 are formed in the same way as described with reference to FIGS. 13 and 14. The diffusion regions D1 are a pair of n-type semiconductor regions provided in the memory cell region 1A. The diffusion regions D2 are a pair of n-type semiconductor regions provided in the peripheral circuit region 1B. This results in formation of the source/drain regions including the extension regions EX1 and the diffusion regions D1 in the memory cell region 1A, and formation of the source/drain regions including the extension regions EX2 and the diffusion regions D2 in the peripheral circuit region 1B.

Figure 27:
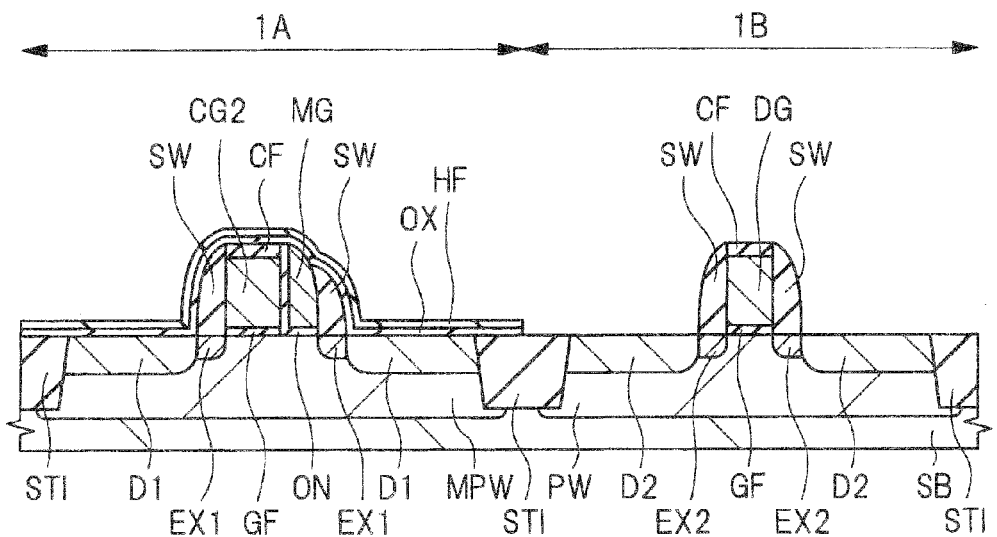
FIG. 27 is a sectional view of the semiconductor device during the manufacturing process following FIG. 26.

Subsequently, as illustrated in FIG. 27, steps similar to those described with reference to FIGS. 18 and 19 are performed. Specifically, the insulating film OX and the hydrogen-containing insulating film HF are formed over the semiconductor substrate SB, and then the insulating film OX and the hydrogen-containing insulating film HF in the peripheral circuit region 1B are selectively removed. Subsequently, through heat treatment, hydrogen in the hydrogen-containing insulating film HF, which covers the first stacked film, the ONO film ON, and the memory gate electrode MG in the memory cell region 1A, is diffused and introduced into an interface between the gate insulating film GF and the main surface of the semiconductor substrate SB, and into an interface between the ONO film ON and the main surface of the semiconductor substrate SB. This makes it possible to repair an interfacial defect between the gate insulating film GF and the semiconductor substrate SB, and between the ONO film ON as the gate insulating film and the semiconductor substrate SB.

As in the first embodiment, the hydrogen anneal may be performed after formation of the extension regions EX1 and EX2 but before formation of the sidewalls SW and the diffusion regions D1 and D2. Alternatively, as in the third embodiment, the hydrogen-containing insulating film LHF (see FIG. 21) having a low hydrogen content may be formed before the hydrogen anneal.

Figure 28:
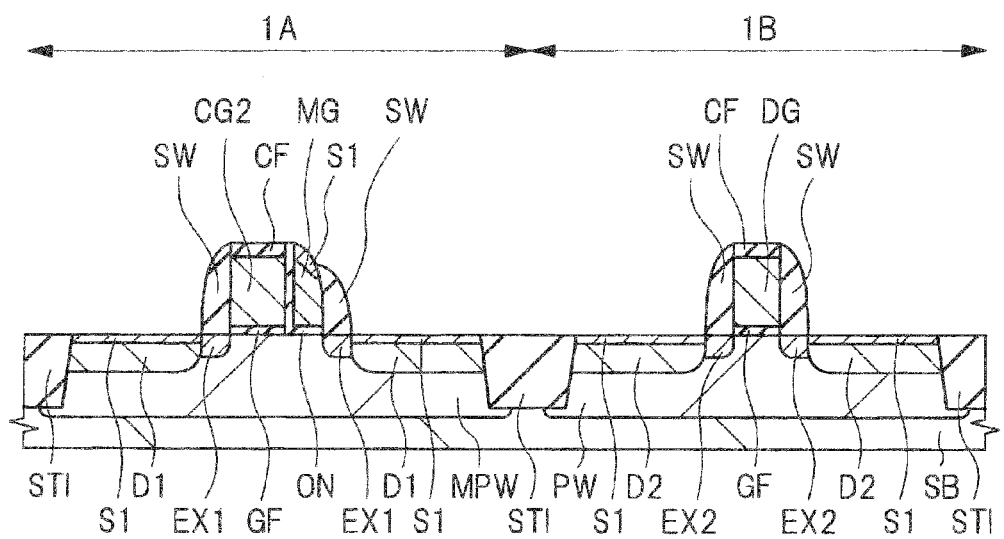
FIG. 28 is a sectional view of the semiconductor device during the manufacturing process following FIG. 27.

Subsequently, as illustrated in FIG. 28, the hydrogen-containing insulating film HF and the insulating film OX are removed, and then silicide is formed through a step similar to that described with reference to FIG. 15. This results in formation of the silicide layer S1 on the surfaces of the diffusion regions D1 and D2 and on the surface of the memory gate electrode MG. Since the upper surfaces of the selective gate electrode CG2 and the dummy gate electrode DG are covered with the insulating film CF, the silicide layer S1 is not formed on such upper surfaces.

Figure 29:
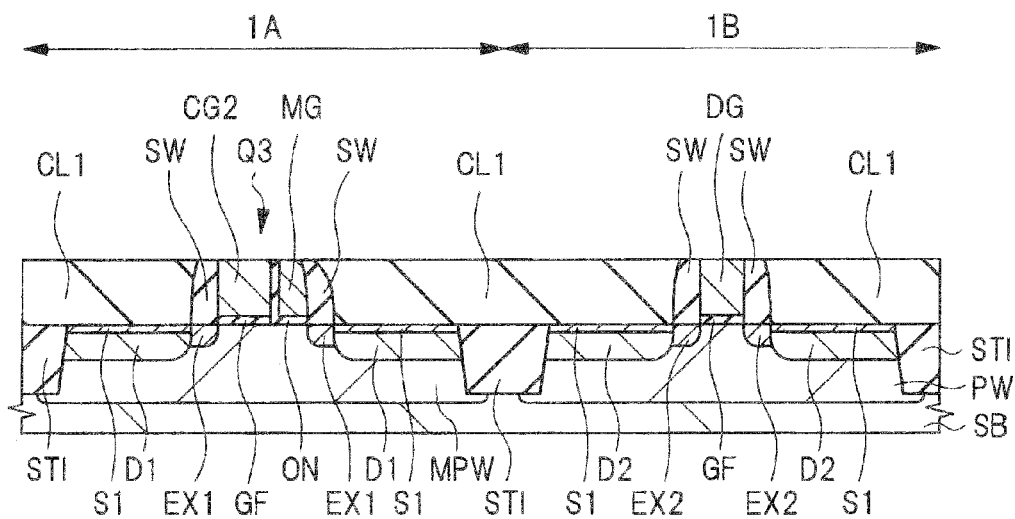
FIG. 29 is a sectional view of the semiconductor device during the manufacturing process following FIG. 28.

Subsequently, as illustrated in FIG. 29, an undepicted etching stopper film and the interlayer insulating film CL1 are formed in this order by, for example, a CVD process so as to cover the entire main surface of the semiconductor substrate SB. The interlayer insulating film CL1 has a thickness larger than each of the first stacked film and the second stacked film, and is formed so as to cover the first stacked film, the memory gate electrode MG, and the second stacked film. Subsequently, the upper surface of the interlayer insulating film CL1 is polished by CMP or the like, thereby the insulating film CF is removed to expose the upper surfaces of the selective gate electrode CG2 and the dummy gate electrode DG. The silicide layer S1 provided on the upper surface of the memory gate electrode MG is polished and removed together.

Consequently, a memory cell Q3 as a split-gate MONOS memory is formed in the memory cell region 1A, the memory cell Q3 including the extension regions EX1, the diffusion regions D1, the selective gate electrode CG2, the ONO film ON, and the memory gate electrode MG.

Specifically, the selective gate electrode CG2 and the pair of source/drain regions configure a selective transistor in the memory cell region 1A, the source/drain regions being provided on upper surfaces of semiconductor substrate SB portions on both sides of the selective gate electrode CG2. Furthermore, the memory gate electrode MG and the source/drain regions configure a memory transistor in the memory cell region 1A, the source/drain regions being provided on upper surfaces of semiconductor substrate SB portions on both sides of the memory gate electrode MG. The ONO film ON under the memory gate electrode MG configures a gate insulating film of the memory transistor.

In this way, the selective transistor and the memory transistor share the pair of source/drain regions, and collectively configure the memory cell Q3.

Figure 30:
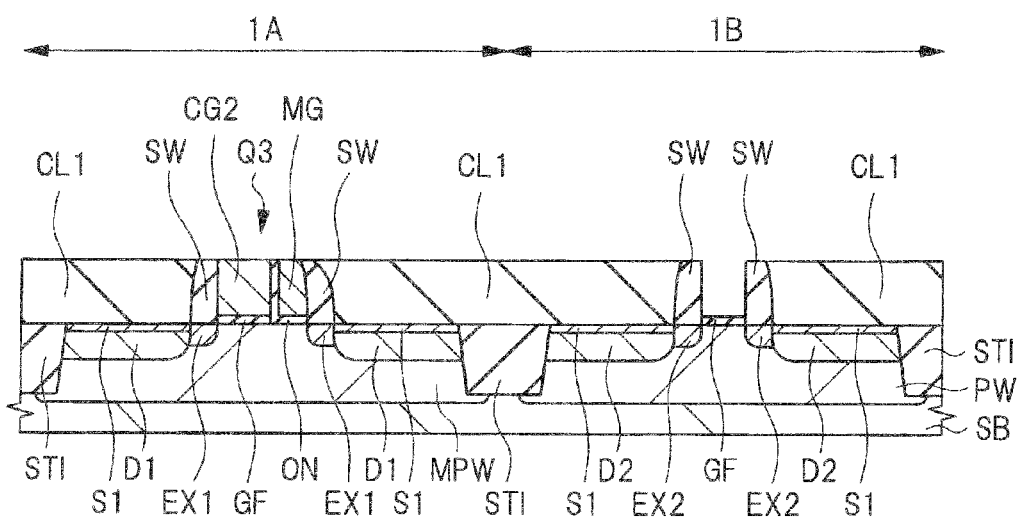
FIG. 30 is a sectional view of the semiconductor device during the manufacturing process following FIG. 29.

Subsequently, as illustrated in FIG. 30, the dummy gate electrode DG in the peripheral circuit region 1B is removed. Specifically, an undepicted resist film, which covers the upper surfaces of the selective gate electrode CG2 and the memory gate electrode MG, is formed in the memory cell region 1A with a photolithography technique.

Subsequently, the dummy gate electrode DG is removed through etching with the resist film as a mask. Subsequently, the resist film is removed. The dummy gate electrode DG is thus removed, and thereby a trench is formed on the gate insulating film GF in the peripheral circuit region 1B. In other words, the trench on the gate insulating film GF in the peripheral circuit region 1B corresponds to a space produced by removing the dummy gate electrode DG.

Figure 31:
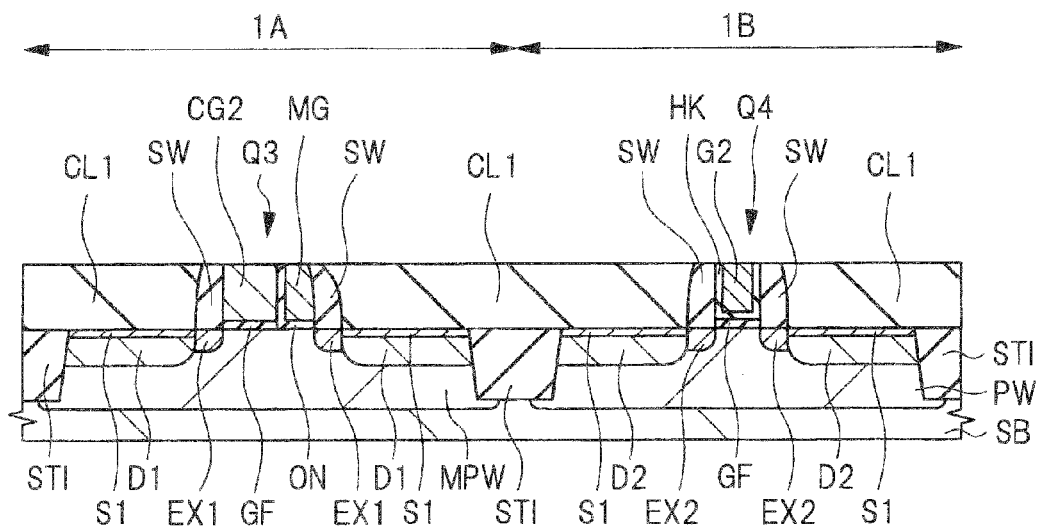
FIG. 31 is a sectional view of the semiconductor device during the manufacturing process following FIG. 30.

Subsequently, as illustrated in FIG. 31, an insulating film HK is formed over the semiconductor substrate SB, i.e., over the interlayer insulating film CL1 and inner faces (a bottom and side walls) of the trench. Subsequently, a metal film as a conductive film for a gate electrode is formed over the semiconductor substrate SB, i.e., over the insulating film HK so as to completely fill the trench. The inside of the trench is not completely filled with the insulating film HK even after the formation step of the insulating film HK, and is completely filled with the metal film. The metal film is also formed over the interlayer insulating film CL1.

The insulating film HK is an insulating film for the gate insulating film, and the metal film is a conductive film for the gate electrode. Specifically, the insulating film HK further serves as the gate insulating film of the low-withstand-voltage MISFET provided in the peripheral circuit region 1B. The insulating film HK is a film of an insulating material having a dielectric constant (specific inductive capacity) higher than each of silicon oxide and silicon nitride, i.e., a so-called high-k film (high dielectric constant film). In this application, the high-k film or the high dielectric constant film refers to a film having a dielectric constant (specific inductive capacity) higher than silicon nitride.

A metal oxide film such as a hafnium oxide film, a zirconia oxide film, an aluminum oxide film, a tantalum oxide film, or a lanthanum oxide film can be used as the insulating film HK. Such a metal oxide film may further contain one or both of nitrogen (N) and silicon (Si). The insulating film HK can be formed by, for example, an atomic layer deposition (ALD) process. The insulating film HK has a thickness of, for example, 3 nm. When the high dielectric constant film (here, the insulating film HK) is used as the gate insulating film, physical thickness of the gate insulating film can be increased compared with the case of using a silicon oxide film; hence, leakage current can be decreased.

Examples of such a metal film include a titanium nitride (TiN) film, a tantalum nitride (TaN) film, a tungsten nitride (WN) film, a titanium carbide (TiC) film, a tantalum carbide (TaC) film, a tungsten carbide (WC) film, tantalum nitride carbide (TaCN) film, a titanium (Ti) film, a tantalum (Ta) film, a titanium aluminum (TiAl) film, and an aluminum (Al) film. The metal film may be configured of a stacked film including some of such films. The metal film described herein refers to a conductive film exhibiting metallic conductivity, and includes not only a simple metal film (pure metal film) or an alloy film, but also a metal compound film exhibiting metallic conductivity. The metal film can by formed by a sputtering process, for example.

For example, the metal film is configured of a stacked film including a titanium nitride (TiN) film and an aluminum (Al) film on the titanium nitride film. In such a case, the aluminum film is preferably thicker than the titanium nitride film. The aluminum film ensures low resistance of a gate electrode G2 to be formed later because of its low resistance. For better understanding of the drawing, FIG. 31 omits illustration of the stacking structure of the stacked film, and shows the metal film in a form of one film.

Subsequently, the unnecessary metal film and insulating film HK outside the trench are removed by CMP or the like, so that the insulating film HK and the metal film are left in the trench in the peripheral circuit region 1B. This results in formation of the gate electrode G2 formed of the metal film filling the trench on the gate insulating film GF in the peripheral circuit region 1B. Consequently, a low-withstand-voltage MISFET Q4, which includes the extension regions EX2, the diffusion regions D2, and the gate electrode G2 as a metal gate electrode, is formed in the peripheral circuit region 1B.

Specifically, the gate electrode G2 and the pair of source/drain regions configure the low-withstand-voltage MISFET Q4 in the peripheral circuit region 1B, the source/drain regions being provided on the upper surfaces of semiconductor substrate SB portions on both sides of the gate electrode G2. The insulating film HK and the gate insulating film GF directly under the gate electrode G2 configure the gate insulating film of the low-withstand-voltage MISFET Q4.

Figure 32:
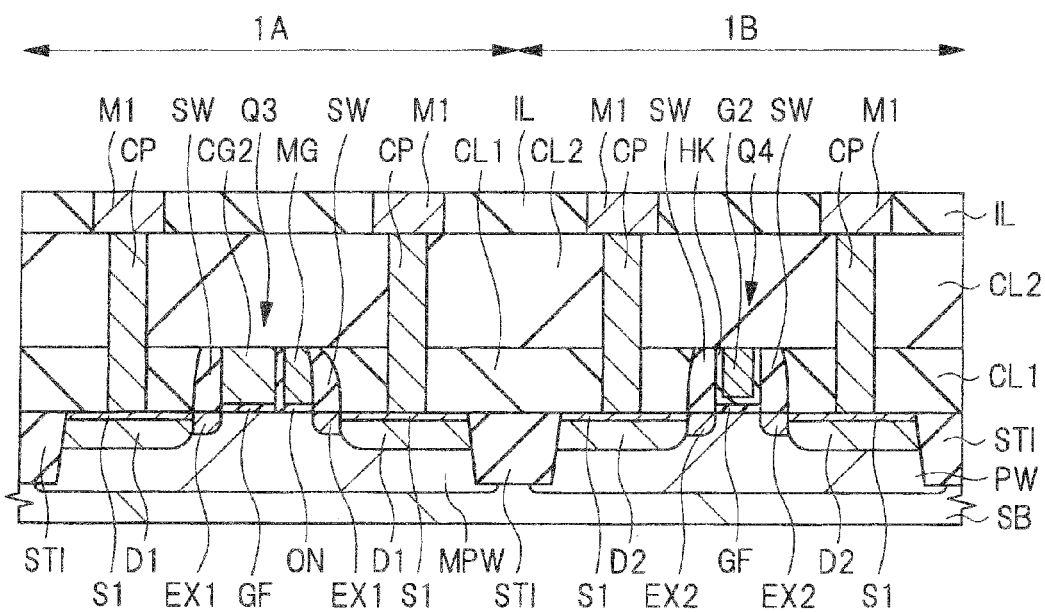
FIG. 32 is a sectional view of the semiconductor device during the manufacturing process following FIG. 31.

Subsequently, as illustrated in FIG. 32, an interlayer insulating film CL2 composed of a silicon oxide film or the like is formed over the main surface of the semiconductor substrate SB by a CVD process, for example. Consequently, the upper surfaces of the interlayer insulating film CL1, the selective gate electrode CG2, the memory gate electrode MG, and the gate electrode G2 are covered with the interlayer insulating film CL2. Subsequently, contact holes penetrating through the interlayer insulating film CL2 and contact holes penetrating through the interlayer insulating films CL2 and CL1 are formed by a photolithography technique and a dry etching process.

The contact holes penetrating through the interlayer insulating film CL2 are each an opening to be filled with a contact plug CP for supplying an electric potential to each of the selective gate electrode CG2, the memory gate electrode MG, and the gate electrode G2. The contact holes penetrating through the interlayer insulating films CL2 and CL1 are each an opening to be filled with a contact plug CP for supplying an electric potential to each of the source/drain regions.

An undepicted silicide layer may be formed over the upper surfaces of the selective gate electrode CG2 and the memory gate electrode MG by a known silicide process. For forming the silicide layer, a metal film is formed while the upper surface of the gate electrode G2 in the peripheral circuit region 1B is covered with an undepicted insulating film, and the metal film is reacted with each of the selective gate electrode CG2 and the memory gate electrode MG, an then the unreacted, excess metal film is removed by a chemical solution. During this step, the metallic gate electrode G2 is covered with the insulating film; hence, the gate electrode G2 is not exposed to the chemical solution and not removed.

Subsequently, a plurality of contact plugs CP, the interlayer insulating film IL, and interconnections M1 are formed through a step similar to that described with reference to FIG. 17, and thereby the semiconductor device of the fourth embodiment is formed. Some of the contact plugs CP are each coupled to the source or drain region. Other contact plugs CP are each coupled to one of the selective gate electrode CG2, the memory gate electrode MG, and the gate electrode G2 in an undepicted region.

An exemplary operation of the nonvolatile memory is now described with reference to FIG. 41.

FIG. 41 is a Table showing an exemplary condition of voltage application to each section of the selected memory cell for "write", "erase", and "read" in the fourth embodiment. The Table of FIG. 41 lists a voltage Vmg applied to the memory gate electrode MG of the memory cell as illustrated in FIG. 32, a voltage Vs applied to the source region thereof, a voltage Vcg applied to the selective gate electrode CG2 thereof, a voltage Vd applied to the drain region thereof, and a base voltage Vb applied to the p-type well in the upper surface of the semiconductor substrate for each of "write", "erase", and "read". The selected memory cell described herein refers to a memory cell selected to be an object for "write", "erase", or "read".

The Table of FIG. 41 shows a preferred, but not limitative, example of a condition of voltage application, and the condition can be varied as necessary. The Table of FIG. 41 shows a case of using the SSI method as a write method, and using the FN method as an erase method. The FN injection method may be used as the write method. However, the band-to-band tunneling (BTBT) method is not used as the erase method.

The SSI method is considered as an operation method in which writing to the memory cell is performed by injecting hot electron into the charge storage film EC. The FN method is considered as an operation method in which write or erase is performed through tunneling of electron or hole. To put the FN method differently, write by the FN method is considered as an operation method in which writing to the memory cell is performed by injecting electron into the silicon nitride film (charge storage film EC illustrated in FIG. 24) through the FN tunneling effect. Erase by the FN method is considered as an operation method in which erasure of the memory cell is performed by injecting hole into the charge storage film EC through the FN tunneling effect. Such operation methods are now described in detail.

This exemplary case uses a write method in which write is performed through source-side hot-electron injection (hot-electron injection write method), i.e., the so-called SSI method.

In the SSI method, write is performed as follows. A voltage shown in "write operation voltage" in the Table of FIG. 41 (Vmg=10 V, Vs=5 V, Vcg=1 V, Vd=0.5 V, Vb=0 V) is applied to each section of the selected memory cell as a writing object. In response to this, electron is injected into the charge storage film EC in the ONO film ON of the selected memory cell to perform write.

At this time, hot electron is generated in the channel region (between the source and the drain) under a region between the two gate electrodes (the memory gate electrode MG and the selective gate electrode CG2), and is injected into the charge storage film EC as a charge storage section in the ONO film ON under the memory gate electrode MG. The injected hot electron is captured in a trap level of the charge storage film EC in the ONO film ON. As a result, the threshold voltage of the memory transistor is raised. In other words, the memory transistor enters into a write state.

In the FN method, erase is performed as follows. A voltage shown in "erase operation voltage" in FIG. 41

(Vmg=12 V, Vs=0 V, Vcg=0 V, Vd=0 V, Vb=0 V) is applied to each section of the selected memory cell as an erasing object. In response to this, in the selected memory cell, hole is injected through tunneling from the memory gate electrode MG into the charge storage film EC in the ONO film ON. At this time, hole is injected from the memory gate electrode MG into the ONO film ON through tunneling through the silicon oxide film (insulating film IF1 illustrated in FIG. 24) by FN tunneling (FN tunneling effect). The hole is captured in a trap level of the charge storage film EC in the ONO film ON. As a result, the threshold voltage of the memory transistor is lowered. In other words, the memory transistor enters into an erase state.

In the FN method, erase may be performed by injecting hole from the semiconductor substrate SB into the charge storage film EC in the ONO film ON through tunneling. In such a case, the erase operation voltage is set to "erase operation voltage" in the Table of FIG. 41 while having opposite polarity.

For read, for example, a voltage shown in "read operation voltage" in FIG. 41 is applied to each section of the selected memory cell as a reading object. The voltage Vmg applied to the memory gate electrode MG for read is set to an intermediate value between the threshold voltage of the memory transistor in the write state and the threshold voltage thereof in the erase state, thereby the state of the memory transistor, i.e., write or erase, can be determined.

As described above with reference to FIGS. 22 to 32, the fourth embodiment employs the so-called gate last process, in which the dummy gate electrode is formed and the source/drain regions are then formed, and then the dummy gate electrode is removed, and subsequently the gate electrode G2 for the low-withstand-voltage MISFET Q4 is formed in the space produced by removing the dummy gate electrode. In other words, for the method of manufacturing the semiconductor device of the fourth embodiment, the element in the peripheral circuit is formed by the gate last process, and the split-gate MONOS memory is formed. In this manufacturing method, hydrogen anneal is selectively performed in the step described with reference to FIG. 27, thereby effects similar to those in the first embodiment can be provided.

Fifth Embodiment

It is now described with reference to FIGS. 33 to 40 that when the semiconductor element is formed by the gate last process in the peripheral circuit region, and when a MONOS memory having a single-gate structure is formed in the memory cell region, hydrogen anneal is performed with a hydrogen-containing insulating film. FIGS. 33 to 40 are each a sectional view of a semiconductor device of a fifth embodiment during a manufacturing process of the semiconductor device. Each of FIGS. 33 to 40 also illustrates the memory cell region 1A on its left side and the peripheral circuit region 1B on its right side.

Figure 33:
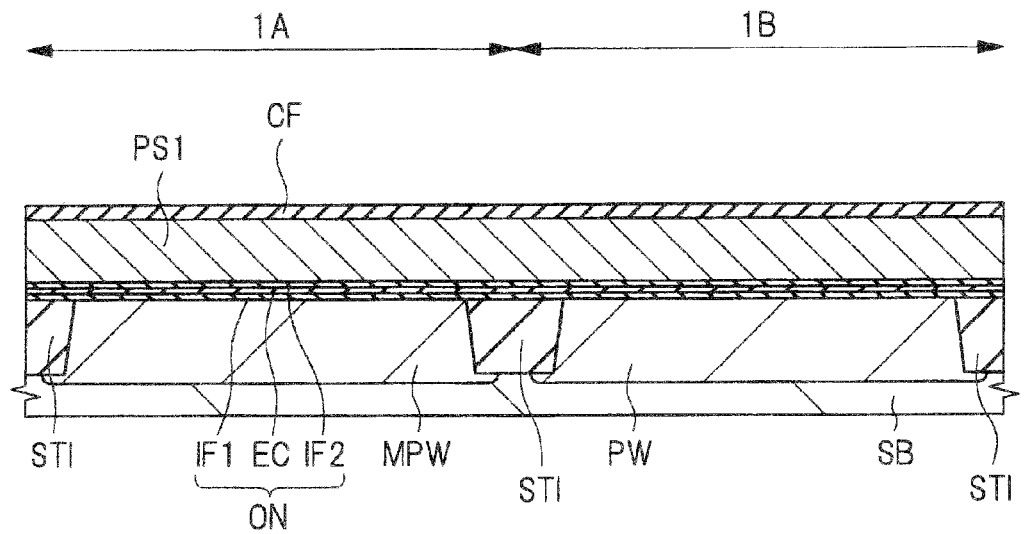
FIG. 33 is a sectional view of a semiconductor device of a fifth embodiment during a manufacturing process of the semiconductor device.

First, as illustrated in FIG. 33, the semiconductor substrate SB is provided, and then element isolation regions STI are formed in trenches provided in the main surface of the semiconductor substrate SB. Subsequently, a p-type impurity (for example, boron (B)) is introduced into the main surface of the semiconductor substrate SB by a photolithography technique and an ion implantation process, thereby the p-type well MPW is formed in the main surface of the semiconductor substrate SB in the memory cell region 1A, and the p-type well PW is formed in the main surface of the semiconductor substrate SB in the peripheral circuit region 1B. Subsequently, the ONO film ON composed of a stacked film is formed over the main surface of the semiconductor substrate SB, the stacked film including the insulating film IF1, the charge storage film EC, and the insulating film IF2 stacked in this order. Subsequently, the polysilicon film PS1 and the insulating film CF are formed in this order over the ONO film ON by a CVD process, for example.

Figure 34:
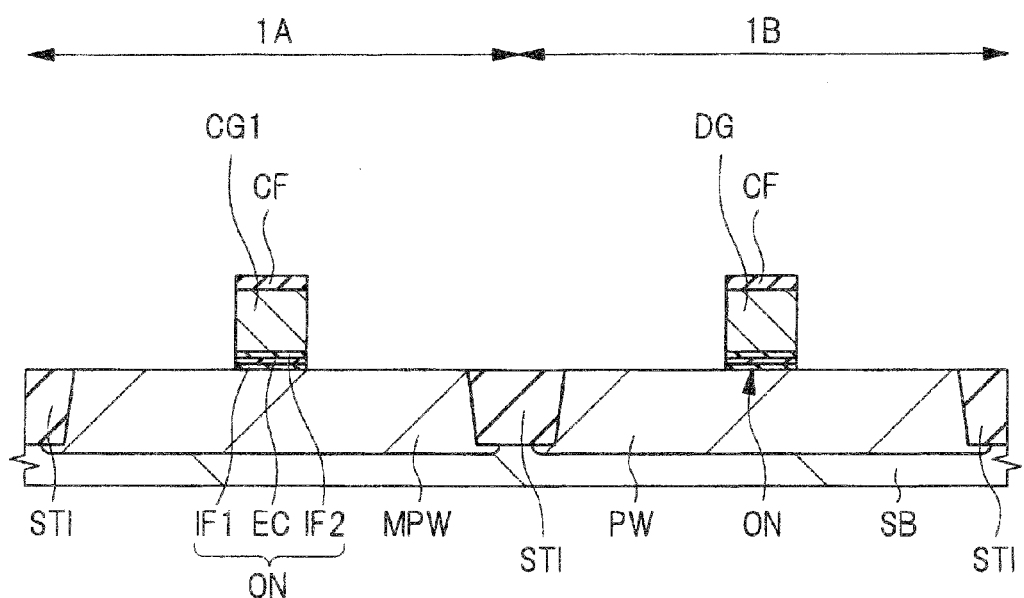
FIG. 34 is a sectional view of the semiconductor device during the manufacturing process following FIG. 33.

Subsequently, as illustrated in FIG. 34, the insulating film CF, the polysilicon film PS1, and the ONO film ON are processed with a photolithography technique and an etching process to expose the main surface of the semiconductor substrate SB. Consequently, the gate electrode CG1 composed of the polysilicon film PS1 and the underlying gate insulating film composed of the ONO film ON are formed in the memory cell region 1A. Furthermore, through such processing, a dummy gate electrode DG composed of the polysilicon film PS1 and an underlying gate insulating film composed of the ONO film ON are formed in the peripheral circuit region 1B.

Figure 35:
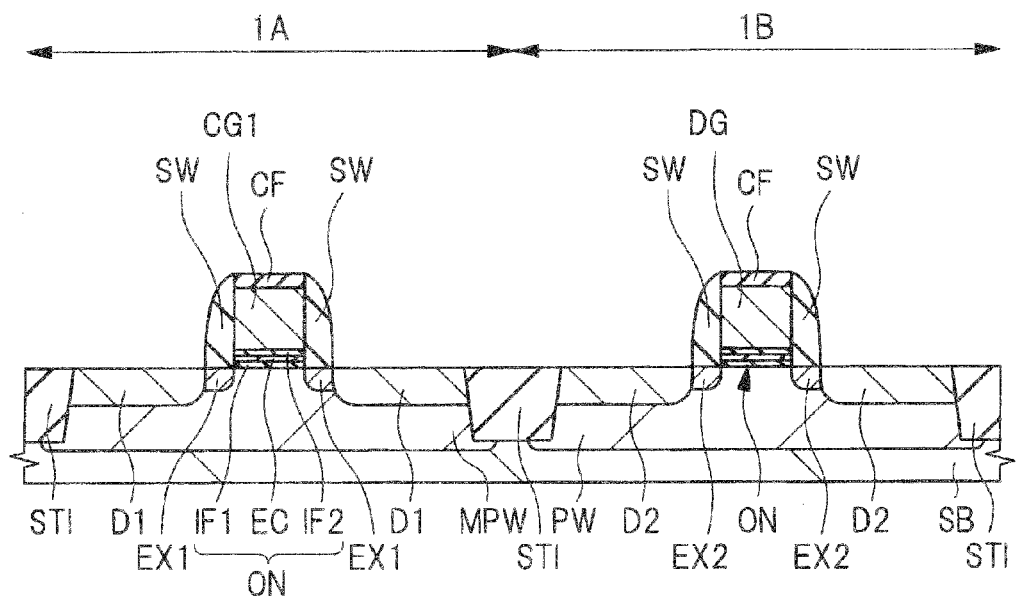
FIG. 35 is a sectional view of the semiconductor device during the manufacturing process following FIG. 34.

Subsequently, as illustrated in FIG. 35, the extension regions EX1 and EX2, the halo regions, the sidewalls SW, and the diffusion regions D1 and D2 are formed in the same way as described with reference to FIG. 26. FIG. 35 omits illustration of the pair of halo regions formed in the peripheral circuit region 1B.

Figure 36:
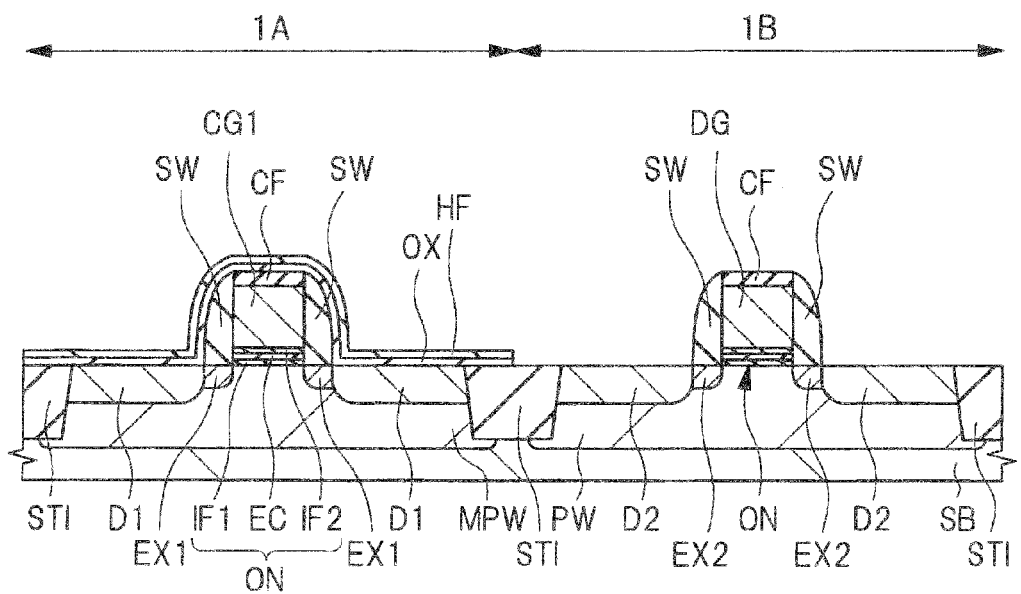
FIG. 36 is a sectional view of the semiconductor device during the manufacturing process following FIG. 35.

Subsequently, as illustrated in FIG. 36, steps similar to those described with reference to FIGS. 18 and 19 are performed. Specifically, the insulating film OX and the hydrogen-containing insulating film HF are formed over the semiconductor substrate SB, and then the insulating film OX and the hydrogen-containing insulating film HF in the peripheral circuit region 1B are selectively removed. Subsequently, hydrogen in the hydrogen-containing insulating film HF, which covers the gate electrode CG1, the ONO film ON, and the sidewalls SW in the memory cell region 1A, is diffused through heat treatment and introduced into an interface between the ONO film ON as the gate insulating film and the main surface of the semiconductor substrate SB. This makes it possible to repair an interfacial defect between the ONO film ON as the gate insulating film in the memory cell region 1A and the semiconductor substrate SB.

As in the first embodiment, the hydrogen anneal may be performed after formation of the extension regions EX1 and EX2 but before formation of the sidewalls SW and the diffusion regions D1 and D2. Alternatively, as in the third embodiment, the hydrogen-containing insulating film LHF (see FIG. 21) having a low hydrogen content may be formed before the hydrogen anneal.

Figure 37:
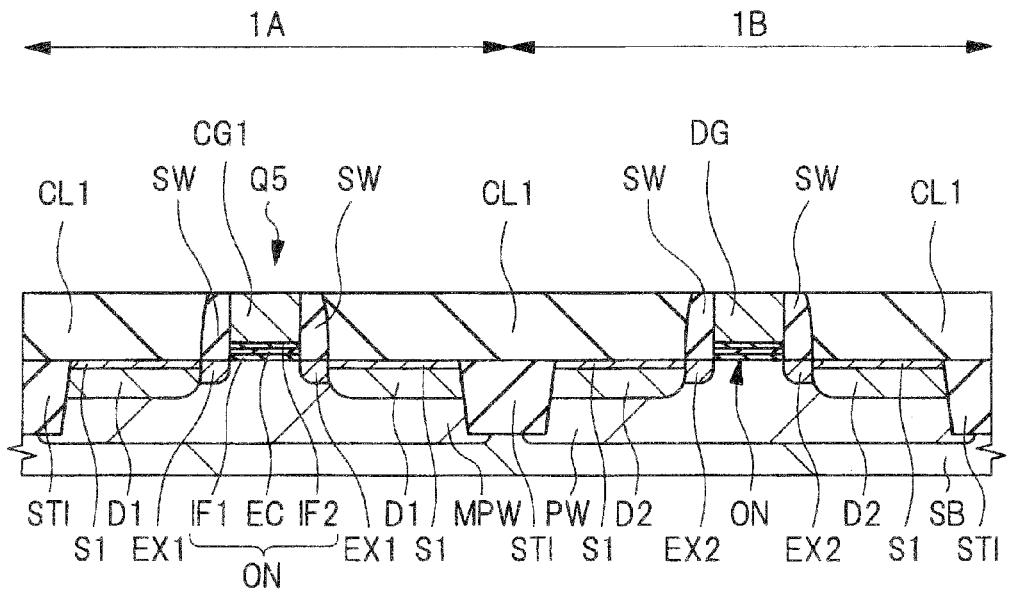
FIG. 37 is a sectional view of the semiconductor device during the manufacturing process following FIG. 36.

Subsequently, as illustrated in FIG. 37, the hydrogen-containing insulating film HF and the insulating film OX are removed, and then silicide is formed through a step similar to that described with reference to FIG. 15. This results in formation of the silicide layer S1 on the surfaces of the diffusion regions D1 and D2. Since the upper surfaces of the gate electrode CG1 and the dummy gate electrode DG are covered with the insulating film CF, the silicide layer S1 is not formed on such upper surfaces.

Subsequently, an undepicted etching stopper film and the interlayer insulating film CL1 are formed in this order by, for example, a CVD process so as to cover the entire main surface of the semiconductor substrate SB. Subsequently, the upper surface of the interlayer insulating film CL1 is polished by CMP or the like, thereby the insulating film CF is removed, and the upper surfaces of the gate electrode CG1 and the dummy gate electrode DG are exposed.

Consequently, a memory cell Q5 as a single-gate MONOS memory, which includes the extension regions EX1, the diffusion regions D1, the gate electrode CG1, and the ONO film ON, is formed in the memory cell region 1A.

Figure 38:
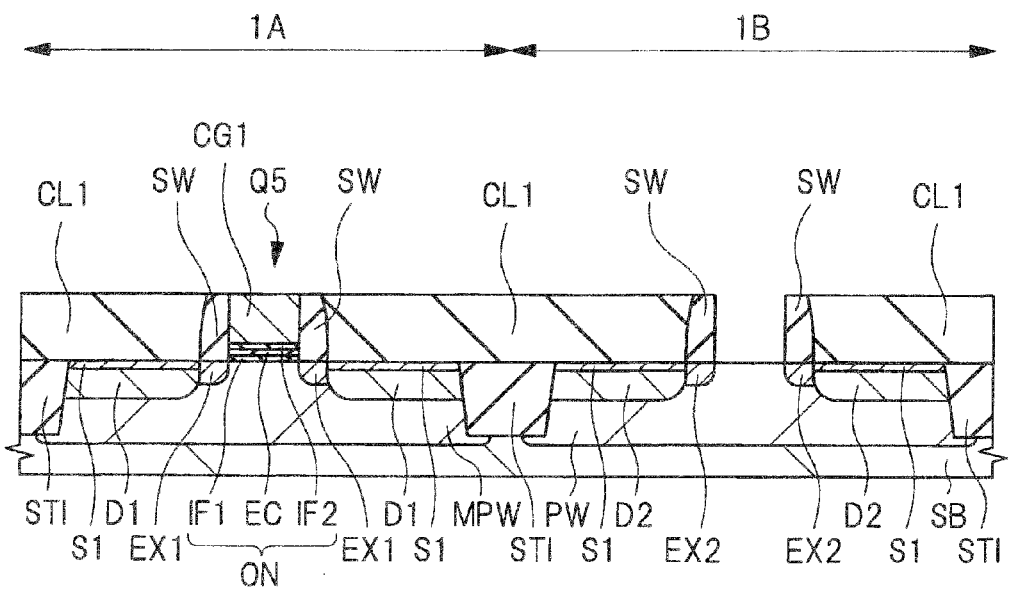
FIG. 38 is a sectional view of the semiconductor device during the manufacturing process following FIG. 37.

Subsequently, as illustrated in FIG. 38, the dummy gate electrode DG in the peripheral circuit region 1B is removed through a step similar to that described with reference to FIG. 30. Subsequently, the ONO film ON in the peripheral circuit region 1B is removed. This results in formation of a trench that corresponds to a space produced by removing the ONO film ON and the dummy gate electrode DG.

Figure 39:
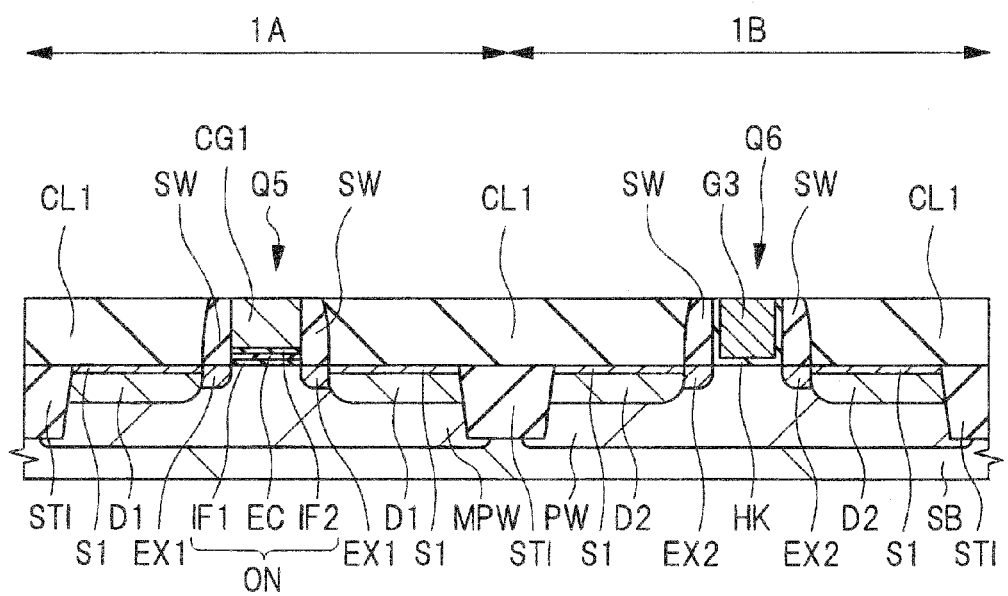
FIG. 39 is a sectional view of the semiconductor device during the manufacturing process following FIG. 38.

Subsequently, as illustrated in FIG. 39, the insulating film HK as a high-k film and a gate electrode G3 as a metal gate electrode are formed in the trench through a step similar to that described with reference to FIG. 39. Consequently, a low-withstand-voltage MISFET Q6, which includes the extension regions EX2, the diffusion regions D2, and the gate electrode G3 as a metal gate electrode, is formed in the peripheral circuit region 1B.

Specifically, the gate electrode G3 and a pair of source/drain regions, which are provided on the upper surfaces of semiconductor substrate SB portions on both sides of the gate electrode G3, configure the low-withstand-voltage MISFET Q6 in the peripheral circuit region 1B. The insulating film HK directly under the gate electrode G3 configures the gate insulating film of the low-withstand-voltage MISFET Q6.

Figure 40:
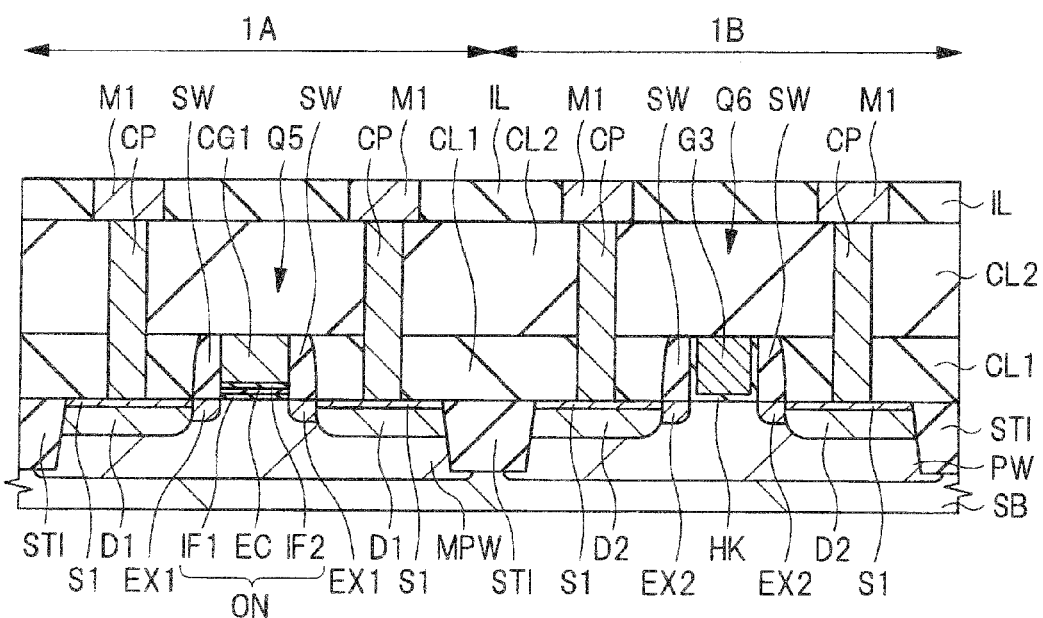
FIG. 40 is a sectional view of the semiconductor device during the manufacturing process following FIG. 39.

Subsequently, as illustrated in FIG. 40, the interlayer insulating film CL2, a plurality of contact holes, a plurality of contact plugs CP, the interlayer insulating film IL, and a plurality of interconnections M1 are formed through a step similar to that described with reference to FIG. 32. Consequently, the semiconductor device of the fifth embodiment is formed. Some of the contact plugs CP are each coupled to the source or drain region. Other contact plugs CP are each coupled to one of the gate electrode CG1 and the gate electrode G3 in an undepicted region.

The memory cell Q5 formed in the memory cell region 1A in the fifth embodiment is a nonvolatile memory to which writing is performed through operation similar to that of the memory cell Q1 (see FIG. 17) described in the first embodiment.

As described above, in the fifth embodiment, the low-withstand-voltage MISFET Q6 is formed by the so-called gate last process in the peripheral circuit region 1B. Specifically, in the method of manufacturing the semiconductor device of the fifth embodiment, the element is formed by the gate last process in the peripheral circuit region, and the single-gate MONOS memory is formed in the memory cell region. In the manufacturing method, hydrogen anneal is selectively performed in the step described with reference to FIG. 36, thereby effects similar to those in the first embodiment can be provided.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A method of manufacturing a semiconductor device including a memory cell of a nonvolatile memory, the method comprising the steps of:
   (a) providing a semiconductor substrate having an upper surface including a first region and a second region;
   (b) forming a first gate electrode over the semiconductor substrate in the first region with a first insulating film including a charge storage film in between, and forming a second gate electrode over the semiconductor substrate in the second region with a second insulating film in between;
   (c) forming a hydrogen-containing insulating film over the semiconductor substrate in the first region, the hydrogen-containing insulating film covering the first insulating film and the first gate electrode and exposing the second region;
   (d) after the step (c), performing heat treatment on the semiconductor substrate and the hydrogen-containing insulating film, where hydrogen in the hydrogen-containing insulating film is diffused by the heat treatment into an interface between the first insulating film and the semiconductor substrate;
   (e) after the step (d), removing the hydrogen-containing insulating film; and
   (f) forming first source/drain regions over main surface portions of the semiconductor substrate located on both sides of the first gate electrode, and forming second source/drain regions over main surface portions of the semiconductor substrate located on both sides of the second gate electrode,
   wherein the first source/drain regions, the first insulating film, and the first gate electrode configure portions of the memory cell, and
   wherein the second source/drain regions, the second insulating film, and the second gate electrode configure portions of a field effect transistor.

2. The method according to claim 1, wherein the field effect transistor contains a p-type impurity.

3. The method according to claim 2, wherein the p-type impurity comprises boron.

4. The method according to claim 1, wherein in the step (d), the heat treatment is performed in an inert-gas atmosphere.

5. The method according to claim 1, wherein the step (f) further comprises the steps of:
   (f1) forming a pair of first low-concentration impurity diffusion regions in the main surface of the semiconductor substrate in the first region, and forming a pair of second low-concentration impurity diffusion regions in the main surface of the semiconductor substrate in the second region; and
   (f2) forming a pair of first high-concentration impurity diffusion regions in the main surface of the semiconductor substrate in the first region, and forming a pair of second high-concentration impurity diffusion regions in the main surface of the semiconductor substrate in the second region,
   wherein each of the first high-concentration impurity diffusion regions has an impurity concentration higher than each of the first low-concentration impurity diffusion regions,
   wherein each of the second high-concentration impurity diffusion regions has an impurity concentration higher than each of the second low-concentration impurity diffusion regions,
   wherein the first source/drain regions include the first low-concentration impurity diffusion regions and the first high-concentration impurity diffusion regions,
   wherein the second source/drain regions include the second low-concentration impurity diffusion regions and the second high-concentration impurity diffusion regions, and
   wherein the steps (c) to (e) are performed between the step (f1) and the step (f2).

6. The method according to claim 1, wherein the step (f) further comprises the steps of:
   (f1) forming a pair of first low-concentration impurity diffusion regions in the main surface of the semiconductor substrate in the first region, and forming a pair of second low-concentration impurity diffusion regions in the main surface of the semiconductor substrate in the second region; and (f2) forming a pair of first high-concentration impurity diffusion regions in the main surface of the semiconductor substrate in the first region, and forming a pair of second high-concentration impurity diffusion regions in the main surface of the semiconductor substrate in the second region, wherein each of the first high-concentration impurity diffusion regions has an impurity concentration higher than each of the first low-concentration impurity diffusion regions, wherein each of the second high-concentration impurity diffusion regions has an impurity concentration higher than each of the second low-concentration impurity diffusion regions, wherein the first source/drain regions include the first low-concentration impurity diffusion regions and the first high-concentration impurity diffusion regions, wherein the second source/drain regions include the second low-concentration impurity diffusion regions and the second high-concentration impurity diffusion regions, and wherein the step (c) is performed after the step (f2).

7. The method according to claim 1, wherein the memory cell performs information erase by the FN method.

8. The method according to claim 1, further comprising the step of:

(c1) between the steps (c) and (d), forming a third insulating film over the semiconductor substrate, the third insulating film covering the memory cell, the hydrogen-containing insulating film, and the field effect transistor, wherein in the step (d), the heat treatment is performed on the semiconductor substrate, the hydrogen-containing insulating film, and the third insulating film, and wherein the third insulating film has a hydrogen content per volume smaller than the hydrogen-containing insulating film.

9. The method according to claim 1, further comprising the step of:

(g) after the step (b) and prior to (c), forming a fourth insulating film over the semiconductor substrate in the first region.

10. The method according to claim 9, wherein the fourth insulating film comprises silicon oxide.

11. The method according to claim 1, wherein the hydrogen-containing insulating film has a hydrogen content of $1 \times 10^{21}/cm^3$ or more.

12. A method of manufacturing a semiconductor device including a memory cell of a nonvolatile memory, the method comprising the steps of:

(a) providing a semiconductor substrate having an upper surface including a first region and a second region;

(b) forming a first gate electrode over the semiconductor substrate in the first region with a first insulating film including a charge storage film in between, and forming a second gate electrode over the semiconductor substrate in the second region with a second insulating film in between;

(c) forming a hydrogen-containing insulating film over the semiconductor substrate in the first region, the hydrogen-containing insulating film covering the first insulating film and the first gate electrode and exposing the second region;

(d) after the step (c), performing heat treatment;

(e) after the step (d), removing the hydrogen-containing insulating film; and (f) forming first source/drain regions over main surface portions of the semiconductor substrate located on both sides of the first gate electrode, and forming second source/drain regions over main surface portions of the semiconductor substrate located on both sides of the second gate electrode, wherein the first source/drain regions, the first insulating film, and the first gate electrode configure portions of the memory cell, and wherein the second source/drain regions, the second insulating film, and the second gate electrode configure portions of a field effect transistor the method further comprising the step of:

(c1) between the steps (c) and (d), forming a third insulating film over the semiconductor substrate, the third insulating film covering the memory cell, the hydrogen-containing insulating film, and the field effect transistor, wherein in the step (d), the heat treatment is performed on the semiconductor substrate, the hydrogen-containing insulating film, and the third insulating film, and wherein the third insulating film has a hydrogen content per volume smaller than the hydrogen-containing insulating film.

* * * * *